United States Patent
Tsai

(10) Patent No.: US 10,276,511 B1
(45) Date of Patent: Apr. 30, 2019

(54) PACKAGE AND MANUFACTURING METHOD THEREOF

(71) Applicant: Taiwan Semiconductor Manufacturing Co., Ltd., Hsinchu (TW)

(72) Inventor: Po-Hao Tsai, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/964,094

(22) Filed: Apr. 27, 2018

(51) Int. Cl.
| H01L 21/56 | (2006.01) |
| H01L 23/31 | (2006.01) |
| H01L 25/00 | (2006.01) |
| H01L 23/498 | (2006.01) |
| H01L 23/552 | (2006.01) |
| H01L 25/065 | (2006.01) |

(52) U.S. Cl.
CPC .......... H01L 23/552 (2013.01); H01L 21/568 (2013.01); H01L 23/3121 (2013.01); H01L 23/49822 (2013.01); H01L 25/0657 (2013.01); H01L 25/50 (2013.01)

(58) Field of Classification Search
CPC ....... H01L 2224/97; H01L 2224/04105; H01L 2924/181; H01L 2924/3025; H01L 23/3128; H01L 23/552; H01L 23/49822; H01L 21/568
See application file for complete search history.

(56) References Cited

U.S. PATENT DOCUMENTS

| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2017/0263569 | A1* | 9/2017 | Sommer ............... H01L 23/552 |
| 2018/0277489 | A1* | 9/2018 | Han .................. H01L 23/552 |
| 2018/0342466 | A1* | 11/2018 | Lin ....................... H01L 23/562 |

* cited by examiner

*Primary Examiner* — Zandra V Smith
*Assistant Examiner* — John M Parker
(74) *Attorney, Agent, or Firm* — JCIPRNET

(57) ABSTRACT

A package includes a plurality of dies, a wall structure, a plurality of conductive structures, an encapsulant, and a redistribution structure. The wall structure surrounds at least one of the dies. The wall structure has an inner surface facing the at least one of the dies and an outer surface opposite to the inner surface. The conductive structures surround the at least one of the dies. The encapsulant encapsulates the dies, the wall structure, and the conductive structures. At least a portion of the encapsulant is located between the inner surface and the outer surface of the wall structure and penetrates through the wall structure. The redistribution structure is disposed on the encapsulant and is electrically connected to the dies and the conductive structures.

20 Claims, 21 Drawing Sheets

PACKAGE AND MANUFACTURING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. To prevent interference of electromagnetic fields from interrupting operation of the dies in the integrated fan-out packages, proper shielding mechanism within the system is implemented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2M are schematic cross-sectional views illustrating a manufacturing process of a region of the package in FIG. 1.

DETAILED DESCRIPTION

Figure 1:
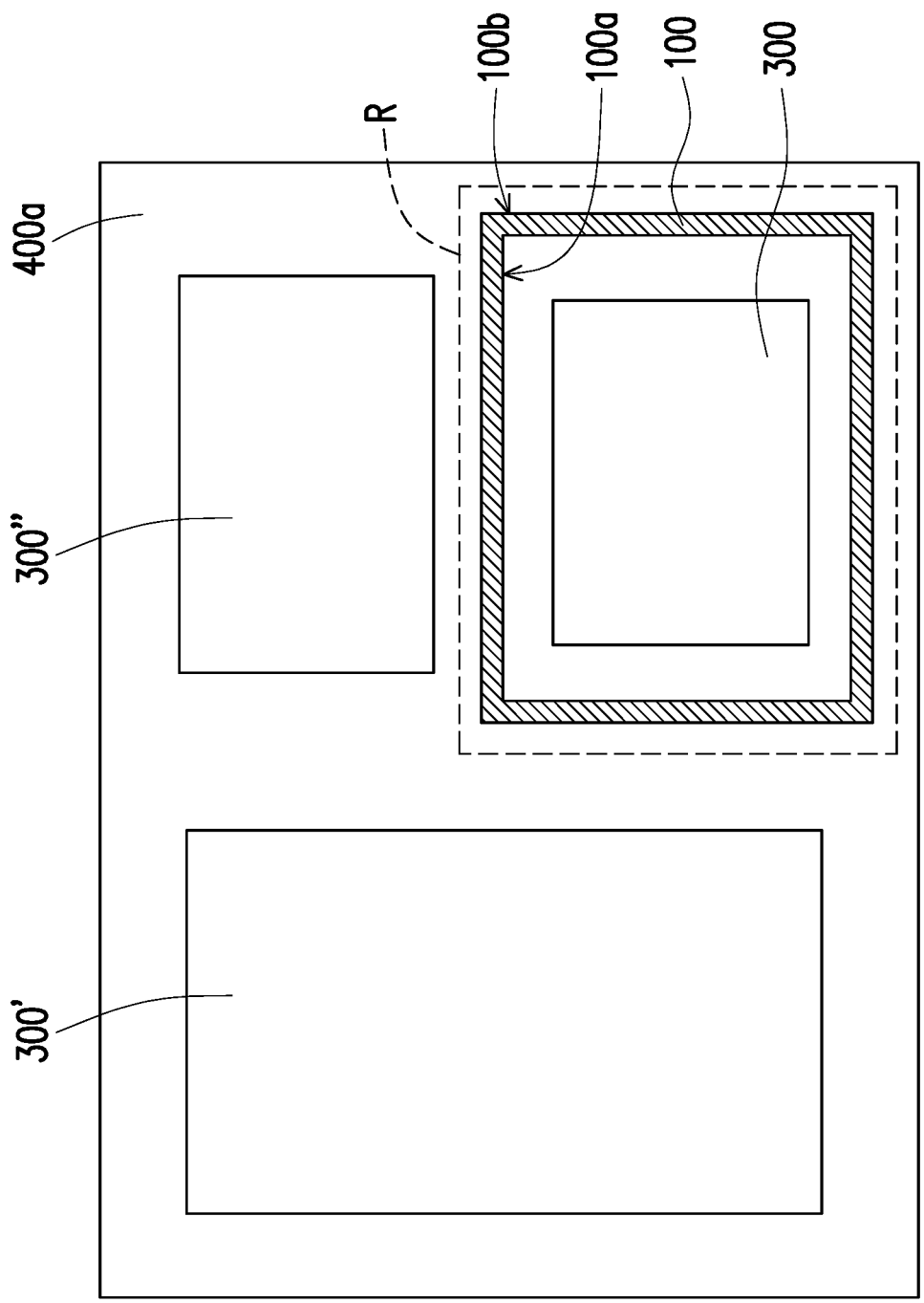
FIG. 1 is a schematic top view illustrating a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic top view illustrating a package 10 in accordance with some embodiments of the disclosure. Referring to FIG. 1, the package 10 includes a first die 300, a second die 300', a third die 300", a wall structure 100, and an encapsulant 400a. The encapsulant 400a encapsulates the first die 300, the second die 300', the third die 300", and the wall structure 100. For simplicity, FIG. 1 merely illustrated the first die 300, the second die 300', the third die 300", the wall structure 100, and the encapsulant 400a to show the relative configurations of these components, and certain components in the package 10 are omitted in the figure. The descriptions with respect to other components in the package 10 will be discussed in great detail later. In some embodiments, the package 10 may be referred to as an integrated fan-out (InFO) package. However, the disclosure is not limited thereto. In some alternative embodiments, the package 10 may be other types of packages.

In some embodiments, the first die 300, the second die 300', and the third die 300" may be the same type of dies performing the same function. In some alternative embodiments, the first die 300, the second die 300', and the third die 300" may be different types of dies performing different functions. The first die 300, the second die 300', and the third die 300" may be a memory die (i.e. DRAM, SRAM, NVRAM, and/or the like), a logic die, or a radio frequency (RF) die. It should be noted that although three dies are shown in FIG. 1, the number of the dies merely serves as an exemplary illustration. In some alternative embodiments, more number of dies or less number of dies may be found in the package 10.

The wall structure 100 has an inner surface 100a and an outer surface 100b opposite to the inner surface 100a. As illustrated in FIG. 1, the inner surface 100a of the wall structure 100 faces the first die 300. In other words, the wall structure 100 surrounds the first die 300. In some embodiments, the first die 300 may be a RF die and the wall structure 100 surrounding the first die 300 may provide the function of electromagnetic interference (EMI) shielding. In some embodiments, since the wall structure 100 merely surrounds one out of the three dies, the wall structure 100 may be referred to as a compartment shielding structure. However, the disclosure is not limited thereto. In some alternative embodiments, the wall structure 100 may surround all three dies to yield a conformal shielding structure. The configuration and the formation method of the wall structure 100 will be discussed below.

Figure 2A:
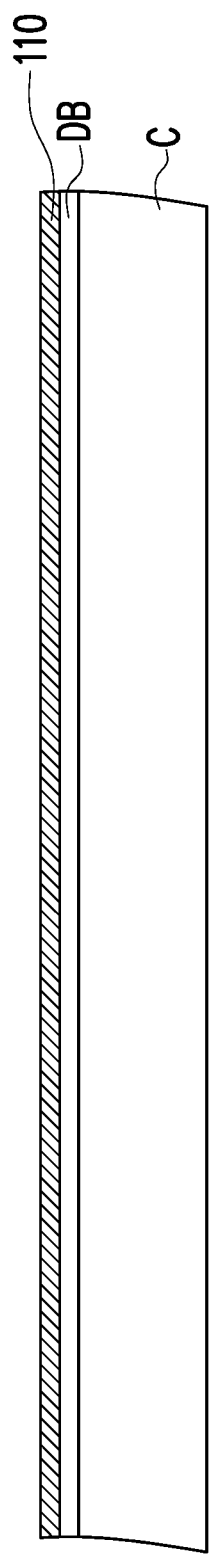

FIG. 2A to FIG. 2M are schematic cross-sectional views illustrating a manufacturing process of a region R of the package 10 in FIG. 1. The following descriptions will focus on the manufacturing process in the region R of the package 10. Referring to FIG. 2A, a carrier C is provided. The carrier C may be a glass substrate. However, the disclosure is not limited thereto, and other suitable materials may be adapted for the carrier C as long as the material is able to withstand the following manufacturing processes while supporting the elements formed thereon. A de-bonding layer DB and a seed material layer 110 are sequentially formed on the carrier C. In some embodiments, the de-bonding layer DB is formed on the upper surface of the carrier C and is located between the carrier C and the seed material layer 110. In some embodiments, the de-bonding layer DB may be a light-to-heat conversion (LTHC) release layer. The seed material layer 110 may include a titanium layer, a copper layer, a titanium/cooper composite layer, or any other suitable conductive material. The seed material layer 110 may be formed through, for example, a sputtering process, a physical vapor deposition (PVD) process, or the like. In some embodiments, the seed material layer 110 helps to enhance the adhesion between the de-bonding layer DB and the elements subsequently formed thereon.

Figure 2B:
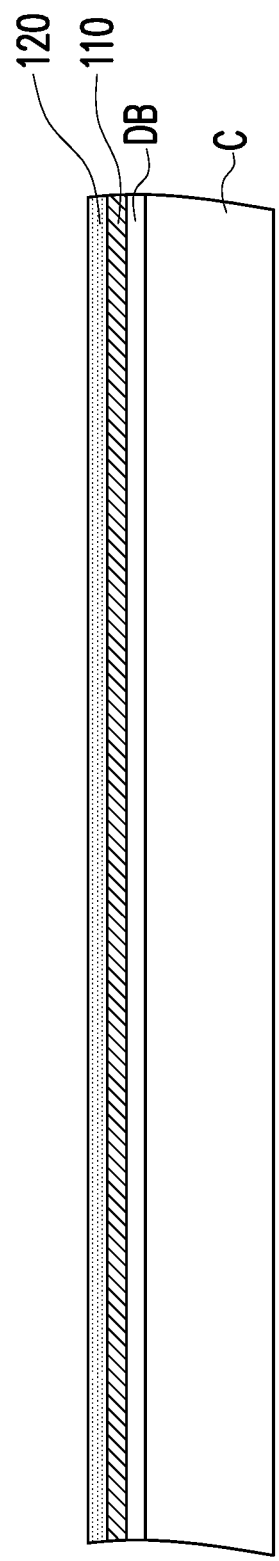

Referring to FIG. 2B, a precursor powder layer 120 is formed over the seed material layer 110. In some embodiments, the precursor powder layer 120 may exists in a liquid form or a slurry form. For example, the precursor powder layer 120 may include a binder and a conductive powder randomly dispersed within the binder. In some embodiments, the binder may include water, isopropyl alcohol, resin, or a combination thereof. In some embodiments, the conductive powder is a heat-fusible powder. For example, the conductive powder may include copper powder, stainless steel powder, solder powder, gold powder, NiFe powder, NiFeCr powder, an alloy thereof, or a combination thereof. In some embodiments, the precursor powder layer 120 may further include dispersing agents to enhance the dispersion of the conductive powder within the binder. However, the disclosure is not limited thereto. In some alternative embodiments, the precursor powder layer 120 may be free of binder and is constituted solely by the conductive powder.

Figure 2C:
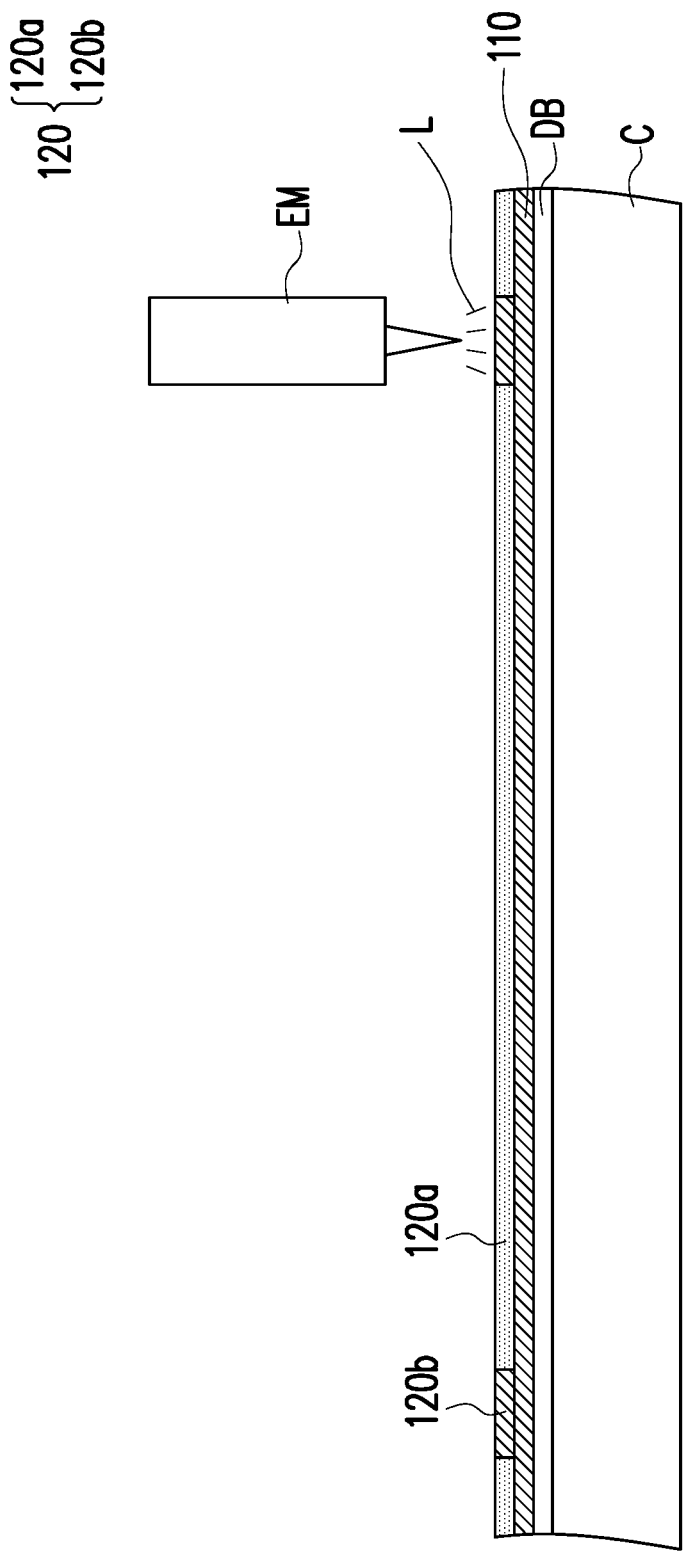

Referring to FIG. 2C, an emitter EM is provided to selectively sinter the heat-fusible conductive powder. In some embodiments, external energy may be provided on certain region of the precursor powder layer 120 to form a desired pattern. For example, the emitter EM may provide a laser beam L to sinter a portion of the precursor powder layer 120. The precursor powder layer 120 exposed to the laser energy is sintered into a solid mass, thereby forming a sintered portion 120b. That is, upon irradiation with the laser beam L, the precursor powder layer 120 is divided into an un-sintered portion 120a and a sintered portion 120b. The sintered portion 120b corresponds to the desired pattern. After forming the sintered portion 120b, the steps illustrated in FIG. 2B and FIG. 2C may be repeated several times to build up the desired pattern. For example, after the emitter EM finished scanning the precursor powder layer 120 illustrated in FIG. 2C, another layer of precursor powder layer (not shown) is deposited onto the precursor powder layer 120. Thereafter, the emitter EM scans the newly formed precursor powder layer to selectively sinter portions of the newly formed precursor. After several iterations, the sintered portion 120b may be built up to the height as illustrated in FIG. 2D.

Figure 2D:
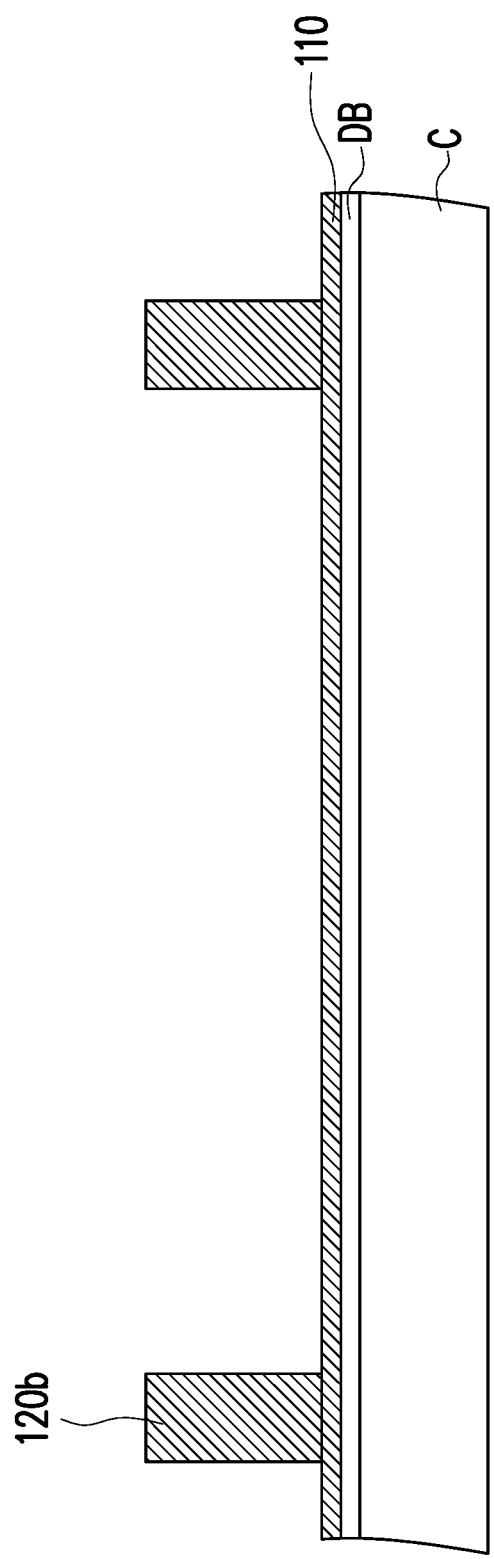

Referring to FIG. 2C and FIG. 2D, after the sintered portion 120b of the precursor powder layer 120 is being built up to a desired shape/height, the un-sintered portion 120a of the precursor powder layer 120 is removed. In some embodiments, the un-sintered portion 120a of the precursor powder layer 120 may be removed by blowing away the conductive powder of the un-sintered portion 120a. However, the disclosure is not limited thereto. Other suitable stripping methods may be adapted to remove the un-sintered portion 120a.

Figure 2E:
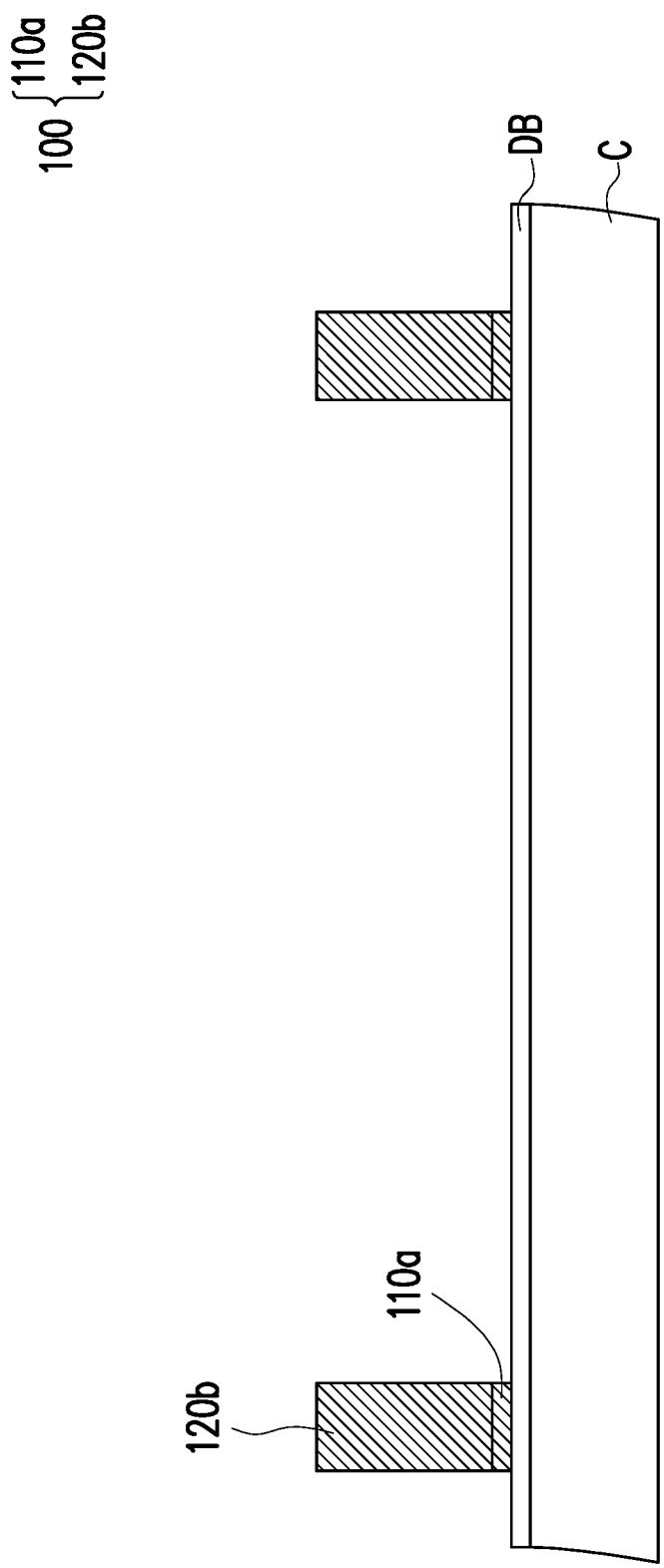

Referring to FIG. 2D and FIG. 2E, portions of the seed material layer 110 is removed to form a seed layer 110a. In some embodiments, the seed material layer 110 underneath the un-sintered portion 120a (shown in FIG. 2C) is removed to form the seed layer 110a. That is, the seed material layer 110 not being covered by the sintered portion 120b is removed. In some embodiments, the sintered portion 120b and the seed layer 110a may be collectively referred to as a wall structure 100. Nevertheless, since the seed layer 110a and the sintered portion 120b are formed by different processes during different stages, an interface may be seen between the seed layer 110a and the sintered portion 120b (shown in FIG. 2E). For simplicity, the interface will be omitted in the later figures. In some embodiments, the processes illustrated in FIG. 2B to FIG. 2D may be referred to as a three-dimensional printing process. For example, the steps illustrated in FIG. 2B to FIG. 2D may correspond to a selective laser sintering (SLS) process. That is, the wall structure 100 is formed over the carrier C through the three-dimensional printing process. In some embodiments, a material of the wall structure 100 includes copper, stainless steel, solder, gold, NiFe, NiFeCr, an alloy thereof, or a combination thereof. Since the wall structure 100 is formed by the three-dimensional printing process, the wall structure 100 may have smooth sidewall profile. In some embodiments, owing to the flexibility provided by the three-dimensional printing process, the wall structure 100 may be fabricated to any desirable height. The configuration of the wall structure 100 will be discussed below in conjunction with FIG. 3A to FIG. 3B and FIG. 4A to FIG. 4C.

Figure 3A:
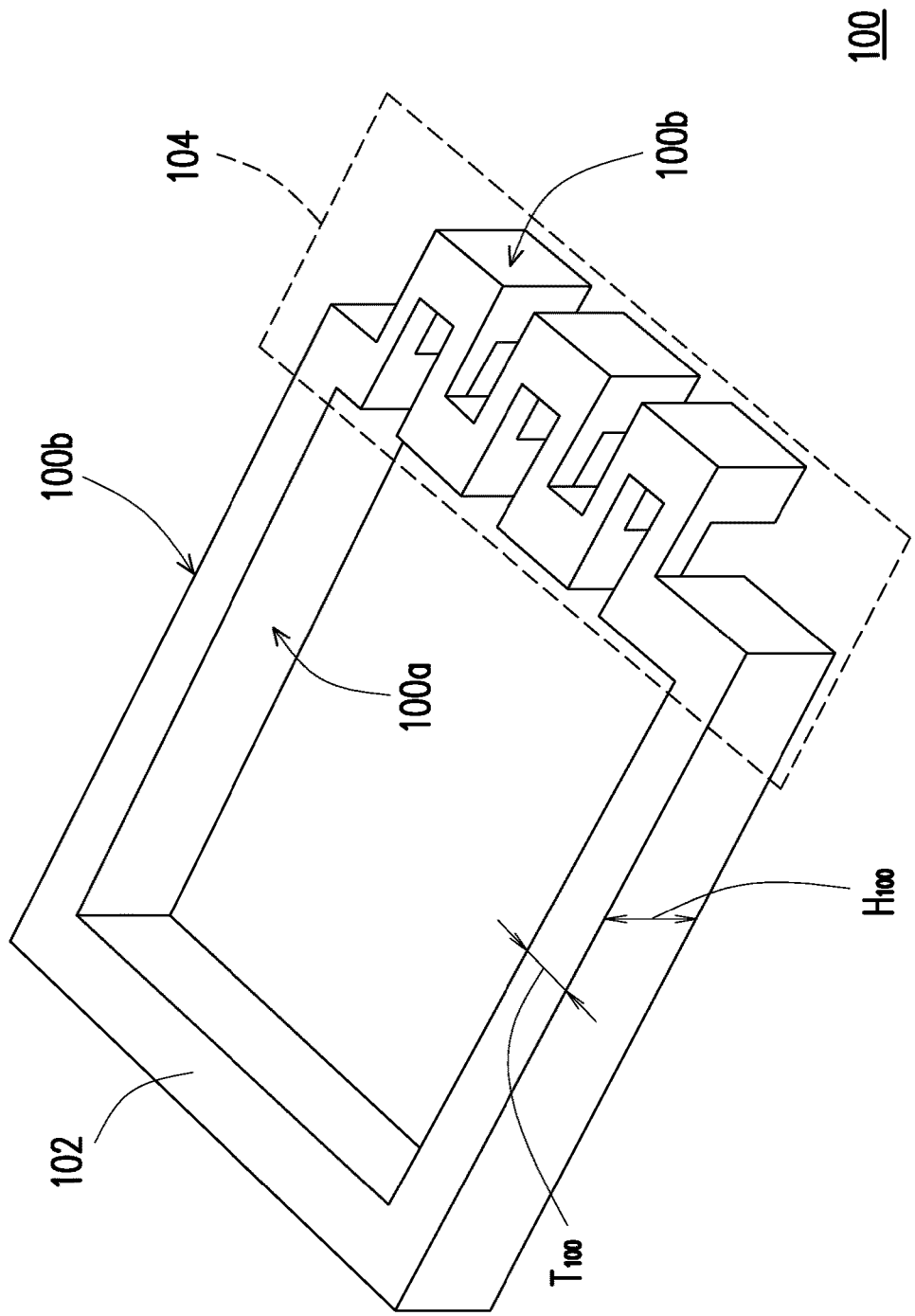
FIG. 3A is a schematic perspective view illustrating a wall structure in accordance with some embodiments of the disclosure.

FIG. 3A is a schematic perspective view illustrating the wall structure 100 in accordance with some embodiments of the disclosure. Referring to FIG. 3A, the wall structure 100 may be divided into a framed portion 102 and a staggered portion 104. The staggered portion 104 is connected to the frame portion 102 to form a loop structure. In some embodiments, the wall structure 100 has a height $H_{100}$ of 50 μm to 1000 μM along the z-axis direction. On the other hand, the wall structure 100 has a thickness $T_{100}$ of 50 μm to 500 μm along the x-axis direction. In some embodiments, the thickness $T_{100}$ of the wall structure 100 may denote a distance between the inner surface 100a and the outer surface 100b. As illustrated in FIG. 3A, the frame portion 102 has a uniform height and a uniform thickness. In other words, a height and a thickness of the frame portion 102 respectively corresponds to the height $H_{100}$ and the thickness $T_{100}$ of the wall structure 100. On the contrary, the staggered portion 104 does not have uniform height. The shape and the dimension of the staggered portion 104 will be described below in conjunction with FIG. 3B.

Figure 3B:
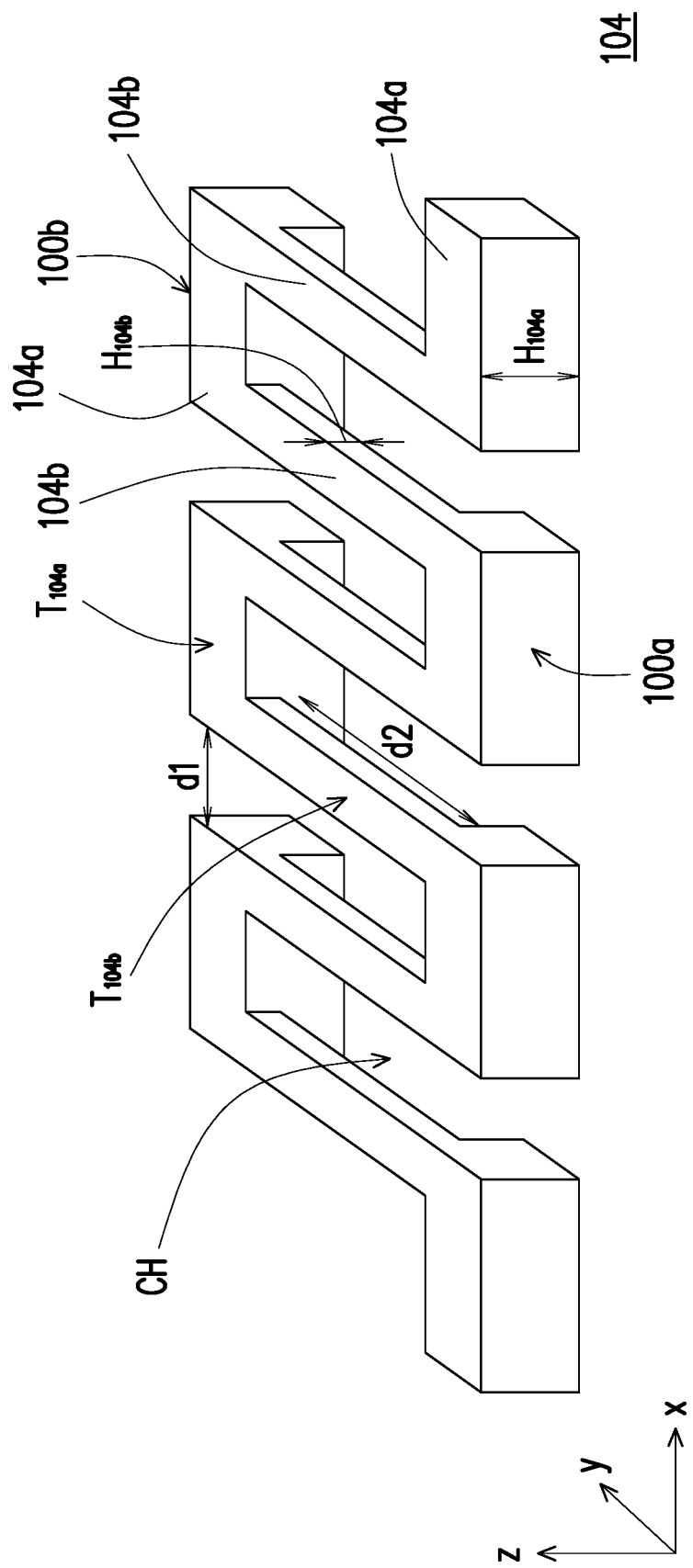
FIG. 3B is a schematic enlarged view illustrating the staggered portion of the wall structure in FIG. 3A.

FIG. 3B is a schematic enlarged view illustrating the staggered portion 104 of the wall structure 10 in FIG. 3A.

Referring to FIG. 3B, the staggered portion 104 includes a plurality of body portions 104a and a plurality of bridge portions 104b. The body portions 104a are separated from each other and are connected by the corresponding bridge portion 104b. In some embodiments, the body portions 104a are arranged along the x-axis direction. That is, the body portions 104a are parallel to each other. On the other hand, the bridge portions 104b are arranged in a parallel manner along the y-axis direction, so as to connect the body portions 104a. In some embodiments, the bridge portions 104b and the body portion 104a may form an included angle. The included angle may be greater than 0° and less than 180°. For example, as illustrated in FIG. 3B, the bridge portions 104b may be perpendicular to the body portions 104a.

In some embodiments, a spacing between two adjacent body portions 104a ranges between 30 μm and 1000 μm. For example, a spacing d1 between two adjacent body portions 104 along the x-axis direction may range between 30 μm and 1000 μm. Similarly, a spacing d2 between two adjacent body portions 104 along the y-axis direction may also range between 30 μm and 1000 μm. In some embodiments, the spacing d2 is equivalent to a length of the bridge portions 104b along the y-axis direction. That is, the length of the bridge portions 104b may range between 30 μm and 1000 μm. The relationship between the spacing d1 and the spacing d2 is not particularly limited. In some embodiments, the spacing d1 may be greater than the spacing d2. However, it construes no limitation in the disclosure. In some alternative embodiments, the spacing d1 may be equal to or smaller than the spacing d2.

In some embodiments, a height $H_{104a}$ of the body portions 104a along the z-axis direction may be the same as the height of the frame portion 102 (the height $H_{100}$ of the wall structure 100). That is, the height $H_{104a}$ of the body portions 104a may range between 50 μm and 1000 μm. On the other hand, a height $H_{104b}$ of the bridge portions 104b along the z-axis direction is smaller than the height $H_{104a}$ of the body portions 104a. For example, the height $H_{104b}$ of the bridge portions 104b may range between 30 μm and 970 μm. In some embodiments, a ratio of the height $H_{104a}$ of the body portions 104a to the height $H_{104b}$ of the bridge portions 104b ranges between 1:19 and 33:1.

In some embodiments, a top surface $T_{104a}$ of the body portions 104a is coplanar with a top surface $T_{104b}$ of the bridge portions 104b. Since the height $H_{104a}$ of the body portions 104a is greater than the height $H_{104b}$ of the bridge portions 104b and the top surface $T_{104a}$ of the body portions 104a is coplanar with the top surface $T_{104b}$ of the bridge portions 104b, a hollow portion is formed below each of the bridge portions 104b. The hollow portion below each bridge portion 104b and the space between two adjacent bridge portions 104b may be collectively referred to as a through channel CH. In some embodiments, the through channel CH penetrates through the wall structure 100 to communicate the inner surface 100a and the outer surface 100b of the wall structure 100.

Referring back to FIG. 3A, although the staggered portion 104 is illustrated as located on one side of the wall structure 100, the disclosure is not limited thereto. In some alternative embodiments, the staggered portion 104 may be located on two sides, three sides, or all four sides of the wall structure 100. When the staggered portion 104 is located on all four sides of the wall structure 100, the wall structure 100 is constituted by four staggered portion 104 without having the framed portion 102. It should be noted that the configurations shown in FIG. 3A and FIG. 3B are merely exemplary illustrations of the wall structure 100, and the disclosure is not limited thereto. In some alternative embodiments, the wall structure 100 may take other forms. Alternative configurations of the wall structure 100 will be presented below in conjunction with FIG. 4A to FIG. 4C.

Figure 4A:
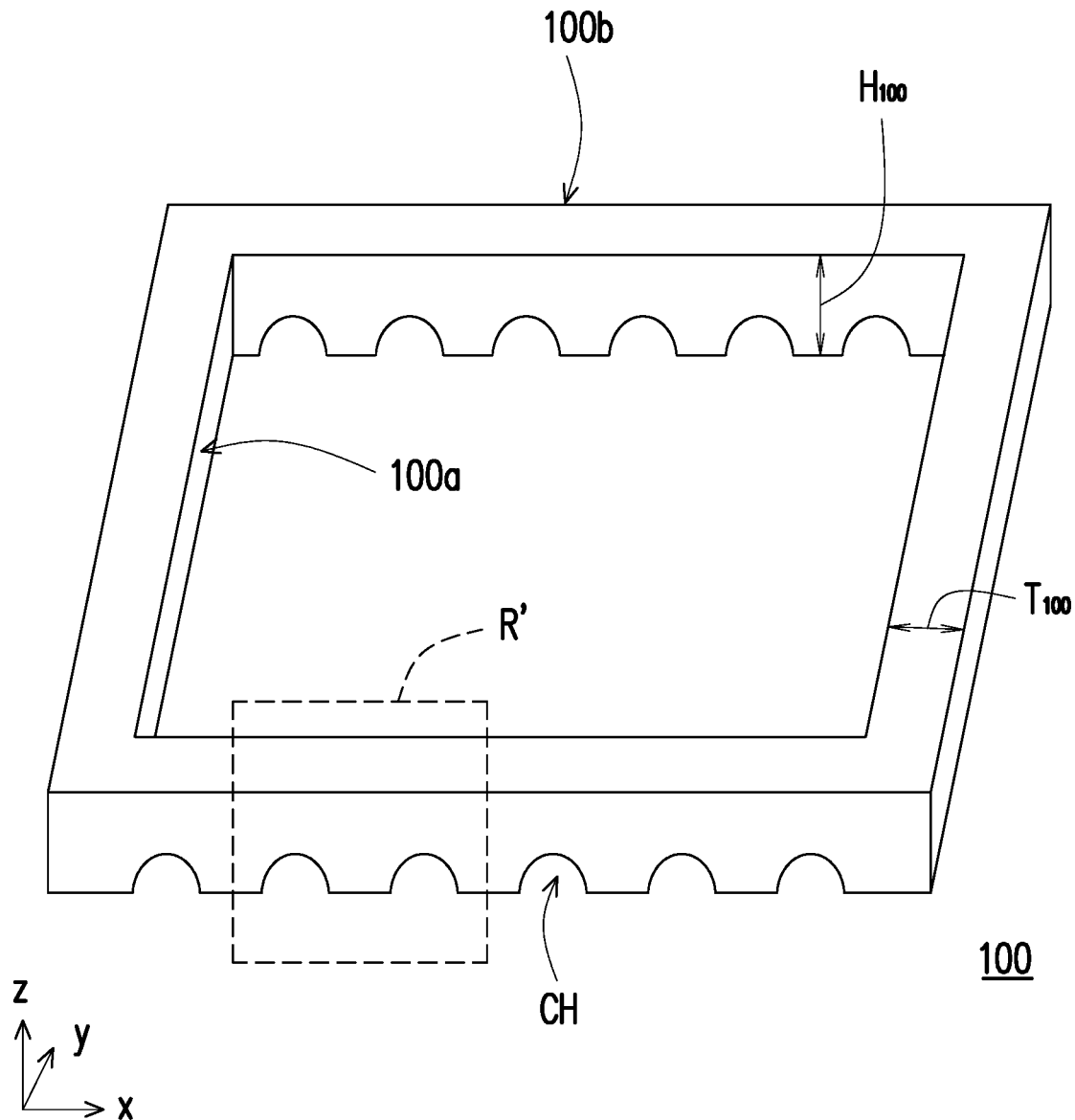
FIG. 4A is a schematic perspective view illustrating a wall structure in accordance with some alternative embodiments of the disclosure.
Figure 4B:
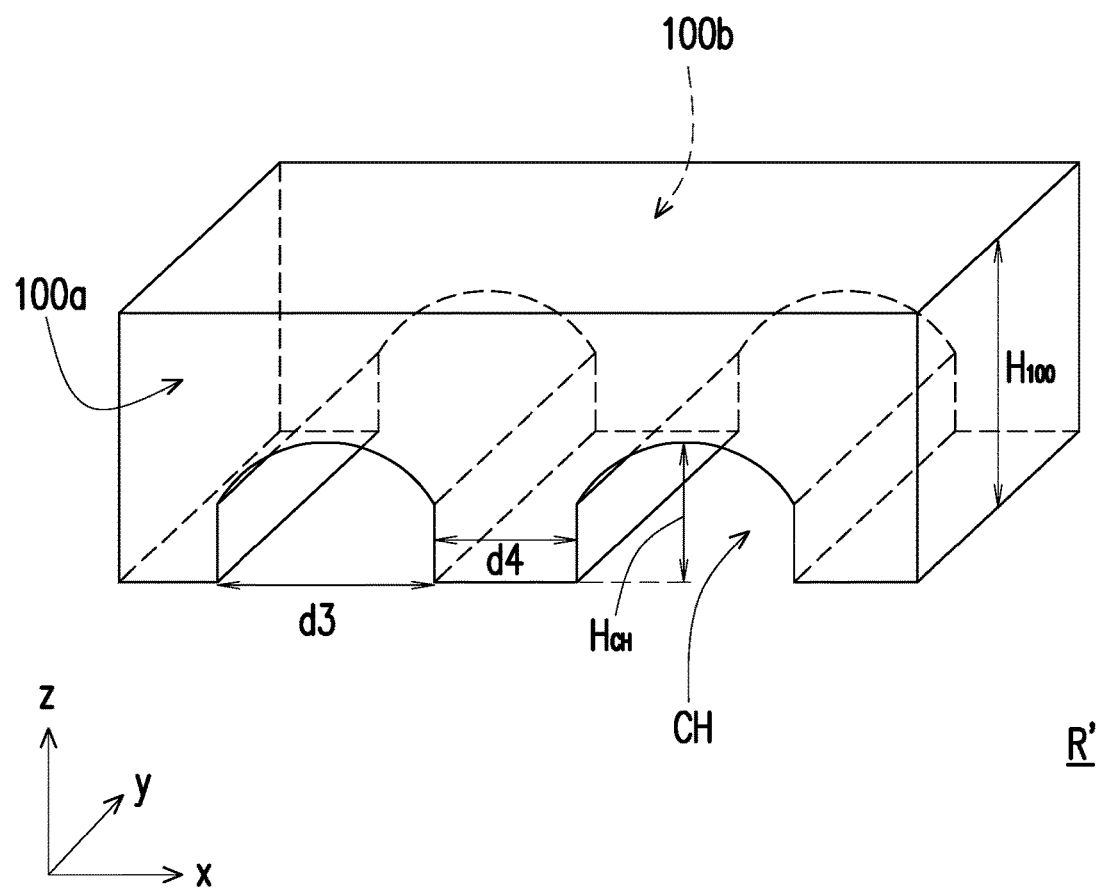
FIG. 4B is a schematic enlarged view illustrating the region of the wall structure in FIG. 4A.

FIG. 4A is a schematic perspective view illustrating a wall structure 100 in accordance with some alternative embodiments of the disclosure. FIG. 4B is a schematic enlarged view illustrating a region R' of the wall structure 100 in FIG. 4A. Referring to FIG. 4A and FIG. 4B, the wall structure 100 may be an enclosed loop structure having a plurality of through channel CH. In some embodiments, each of the through channels CH penetrates through the wall structure 100 to communicate the inner surface 100a and the outer surface 100b of the wall structure 100. The wall structure 100 is shown as a squared loop in FIG. 4A, but the disclosure is not limited thereto. The wall structure 100 may be a loop structure of other geometries, such as polygonal loop or circular loop. In some embodiments, the wall structure 100 has a uniform thickness $T_{100}$ of the 50 μm to 500 μm. For example, the thickness $T_{100}$ of the wall structure 100 between the inner surface 100a and the outer surface 100b along the y-axis direction and the x-axis direction may be identical. In some embodiments, the wall structure 100 has a height $H_{100}$ (maximum height) of 50 μm to 1000 μm along the z-axis direction.

In some embodiments, the through channels CH may be semi-cylindrical column shaped through channels, as illustrated in FIG. 4A and FIG. 4B. However, the disclosure is not limited thereto. In some alternative embodiments, the through channels CH may be polygonal column shaped through channels or cylindrical column shaped channels. In some embodiments, each of the through channels CH may have a width d3 (in the case of polygonal column shaped through channels) or a diameter (in the case of semi-cylindrical column shaped through channels or cylindrical column shaped through channels) of 30 μm to 1000 μm along the x-axis direction. On the other hand, each of the through channels CH has a height $H_{CH}$ of 15 μm to 500 μm along the z-axis direction. In other words, a ratio between the height $H_{CH}$ of the through channel CH to the height $H_{100}$ of the wall structure ranges 100 between 1:67 and 10:1. In some embodiments, a spacing d4 between two adjacent through channels CH may range between 30 μm and 940 μm. In some embodiments, the relationship between the width (or diameter) d3 of the through channels CH and the spacing d4 between two adjacent through channels CH is not particularly limited. In some embodiments, the width (or diameter) d3 may be greater than the spacing d4. However, it construes no limitation in the disclosure. In some alternative embodiments, the width (or diameter) d3 may be equal to or smaller than the spacing d4.

Figure 4C:
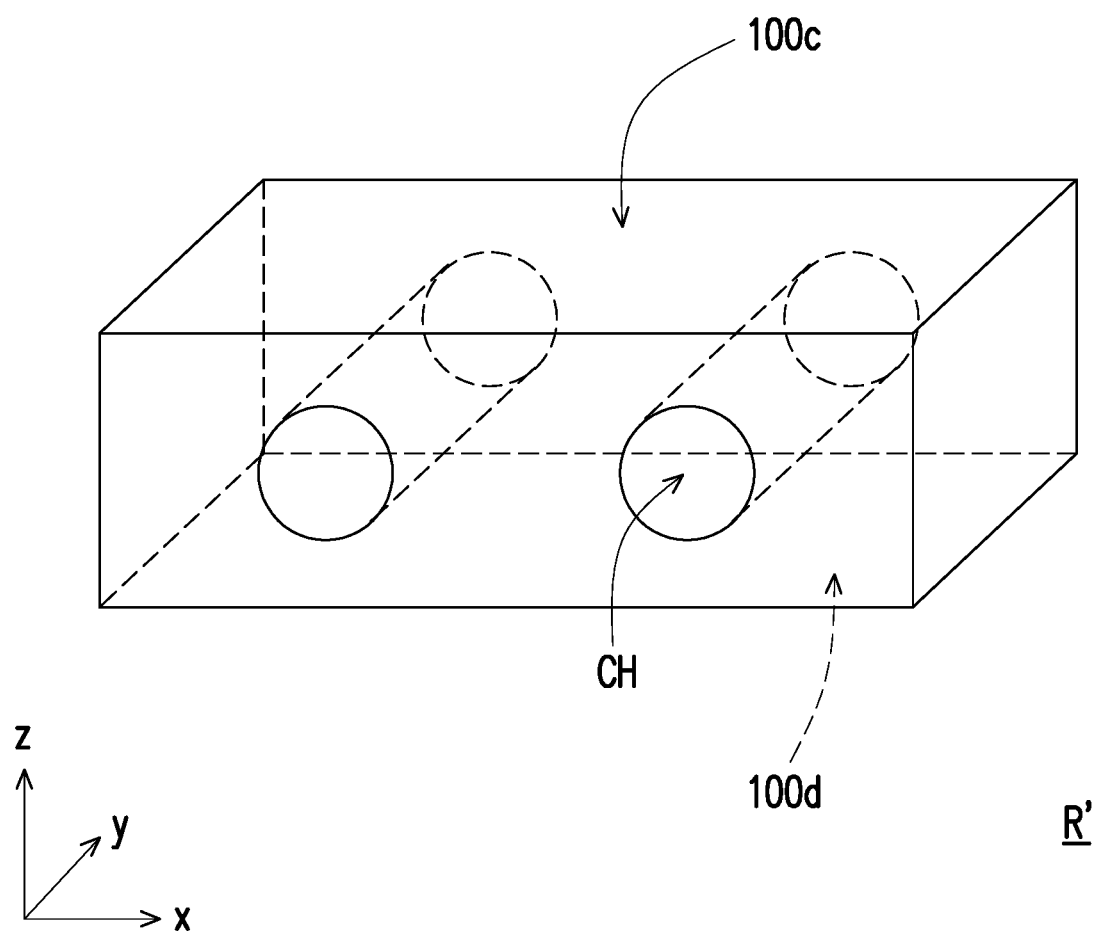
FIG. 4C is a schematic enlarged view illustrating a region of a wall structure in accordance with some alternative embodiments of the disclosure.

It should be noted that in FIG. 4B, the through channels CH are illustrated as located at the bottom of the wall structure 100 such that the bottom surface of the wall structure 100 is being disrupted by the through channels CH. However, the disclosure is not limited thereto. The through channels CH may be located on other locations of the wall structure 100. FIG. 4C is a schematic enlarged view illustrating a region R' of the wall structure 100 in accordance with some alternative embodiments of the disclosure. Referring to FIG. 4C, the cylindrical column shaped through channels CH are located in the middle of the wall structure 100. In other words, the through channels CH are spaced apart from both of a top surface 100c and a bottom surface 100d of the wall structure 100. The through channels CH and the wall structure 100 in FIG. 4C may have the same dimensions as that of the through channels CH and the wall structure 100 shown in FIG. 4B, so the detailed descriptions thereof are omitted herein.

Referring back to FIG. 4A, although the through channels CH are illustrated as located on two opposite sides of the wall structure 100, the disclosure is not limited thereto. In some alternative embodiments, the through channels CH may be located on two adjacent sides of the wall structure 100. In some alternative embodiments, the through channels CH may be located on one single side, three sides, or four sides of the wall structure 100.

Referring back to FIG. 2F, a plurality of conductive structures 200 are formed over the de-bonding layer DB adjacent to the wall structure 100. In some embodiments, the method of forming the conductive structures 200 includes the following steps. First, a first photoresist layer (not shown) is disposed over the wall structure 100 to protect the wall structure 100. Thereafter, a seed material layer (not shown) is formed over the de-bonding layer DB and the first photoresist layer. In some embodiments, the seed material layer includes a titanium/copper composite layer formed by a sputtering process. Subsequently, a second photoresist layer (not shown) with openings is formed on the seed material layer. The openings of the second photoresist layer expose the intended locations for the subsequently formed conductive structures 200. Thereafter, a plating process is performed to form a metal material layer (e.g., a copper layer) on the seed material layer exposed by the openings of the second photoresist layer. The second photoresist layer and the underlying seed material layer are then removed to form the conductive structures 200. Thereafter, the first photoresist layer is also removed. The foregoing method is merely an exemplary illustration of a fabrication method of the conductive structures 200, and the disclosure is not limited thereto. In some alternative embodiments, the conductive structures 200 and the wall structure 100 may share the same seed material layer 110 shown in FIG. 2A. For example, after the sintered portion 120b is formed and the un-sintered portion 120a is removed as illustrated in FIG. 2D, the conductive structures 200 are formed by methods similar to the foregoing processes prior to the removal of the seed material layer 110. In some alternative embodiments, the conductive structures 200 may be formed by pick and place pre-fabricated conductive structures onto the de-bonding layer DB. In some alternative embodiments, the conductive structures 200 may be simultaneously formed with the wall structure 100 through the same three-dimensional printing process.

Figure 2F:
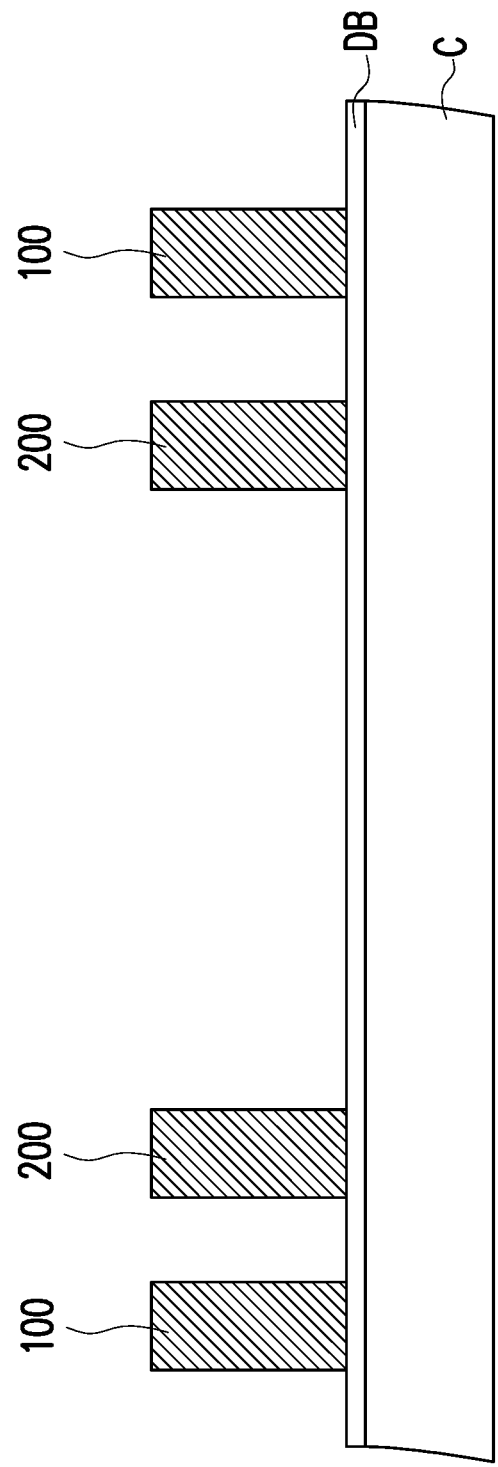

As illustrated in FIG. 2D to FIG. 2F, the wall structure 100 is formed prior to the formation of the conductive structures 200. However, the disclosure is not limited thereto. In some alternative embodiments, the step of forming the conductive structures 200 may precede the step of forming the wall structure 100. Under this scenario, the conductive structures 200 and the wall structure 100 may share the same seed material layer 110 shown in FIG. 2A. For example, after the seed material layer 110 is formed (shown in FIG. 2A), a photoresist layer (not shown) with openings is formed on the seed material layer 110. The openings of the photoresist layer expose the intended locations for the subsequently formed conductive structures 200. Thereafter, a plating process is performed to form a metal material layer (e.g., a copper layer) on the seed material layer 110 exposed by the openings of the photoresist layer. The photoresist layer is then removed to obtain a plurality of metal patterns (not shown) standing on the seed material layer 110. The metal patterns and portions of the seed material layer 110 underneath the metal patterns may later constitute the conductive structures 200. Subsequently, with the seed material layer 110 still blankely formed over the de-bonding layer DB, the three-dimensional printing process shown in FIG. 2B to FIG. 2D are performed. Thereafter, the seed material layer 110 not being covered by the sintered portion 120b and the metal patterns is removed to form the conductive structures 200 and the wall structure 100.

In some embodiments, the conductive structures 200 are formed to have substantially the same height as the wall structure 100. However, the disclosure is not limited thereto. In some alternative embodiments, the conductive structures 200 may be shorter or taller than the wall structure 100.

Figure 2G:
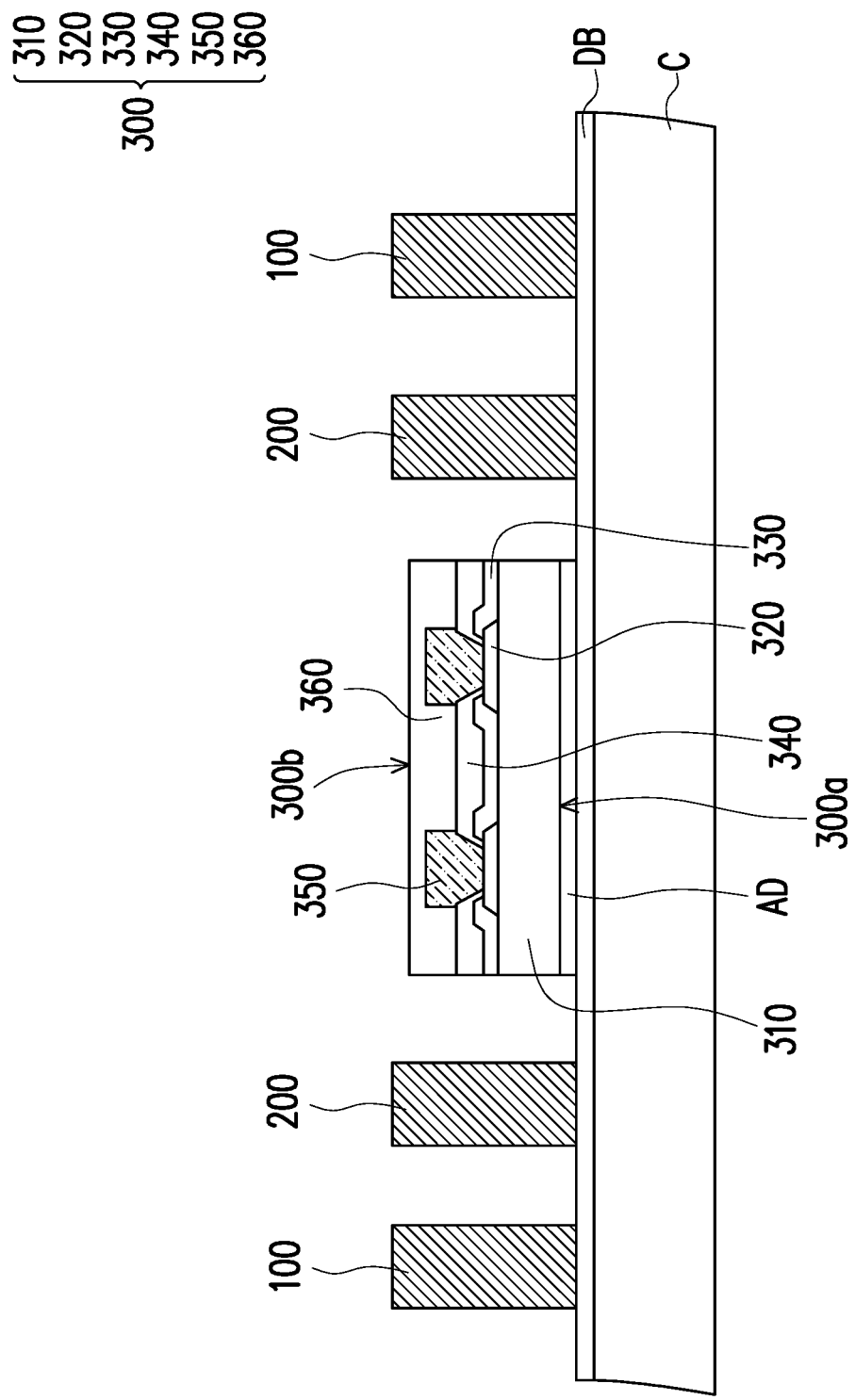

Referring to FIG. 2G, the first die 300 is formed over the de-bonding layer DB. The first die 300 is surrounded by both of the wall structure 100 and the conductive structures 200. In some embodiments, the conductive structures 200 are disposed within the interior of the wall structure 100 such that the conductive structures 200 are located between the wall structure 100 and the first die 300 (shown in FIG. 2G). However, the disclosure is not limited thereto. In some alternative embodiments, the conductive structures 200 are disposed outside of the wall structures 100 such that the wall structure 100 is located between the first die 300 and the conductive structures 200.

In some embodiments, the first die 300 is picked and placed onto the de-bonding layer DB. The first die 300, for example, includes a semiconductor substrate 310, a plurality of conductive pads 320, a passivation layer 330, a post passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a polyimide (PI) layer, a polybenzooxazole (PBO) layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 to cover the conductive vias 350.

As illustrated in FIG. 2G, the first die 300 has a rear surface 300a and a front surface 300b opposite to the rear surface 300a. In some embodiments, the rear surface 300a of the first die 300 is attached (or adhered) to the de-bonding layer DB through an adhesive layer AD. In some embodiments, the adhesive layer AD may include a die attach film (DAF). On the other hand, the front surface 300b of the first die 300 faces upward. As illustrated in FIG. 2G, a top surface (front surface 300b) of the first die 300 is lower than the top surfaces of the conductive structures 200 and the top surface of the wall structure 100. However, the disclosure is not limited thereto. In some alternative embodiments, the top surface of the first die 300 may be substantially coplanar with the top surfaces of the conductive structures 200 and/or the top surface of the wall structure 100.

Figure 2H:
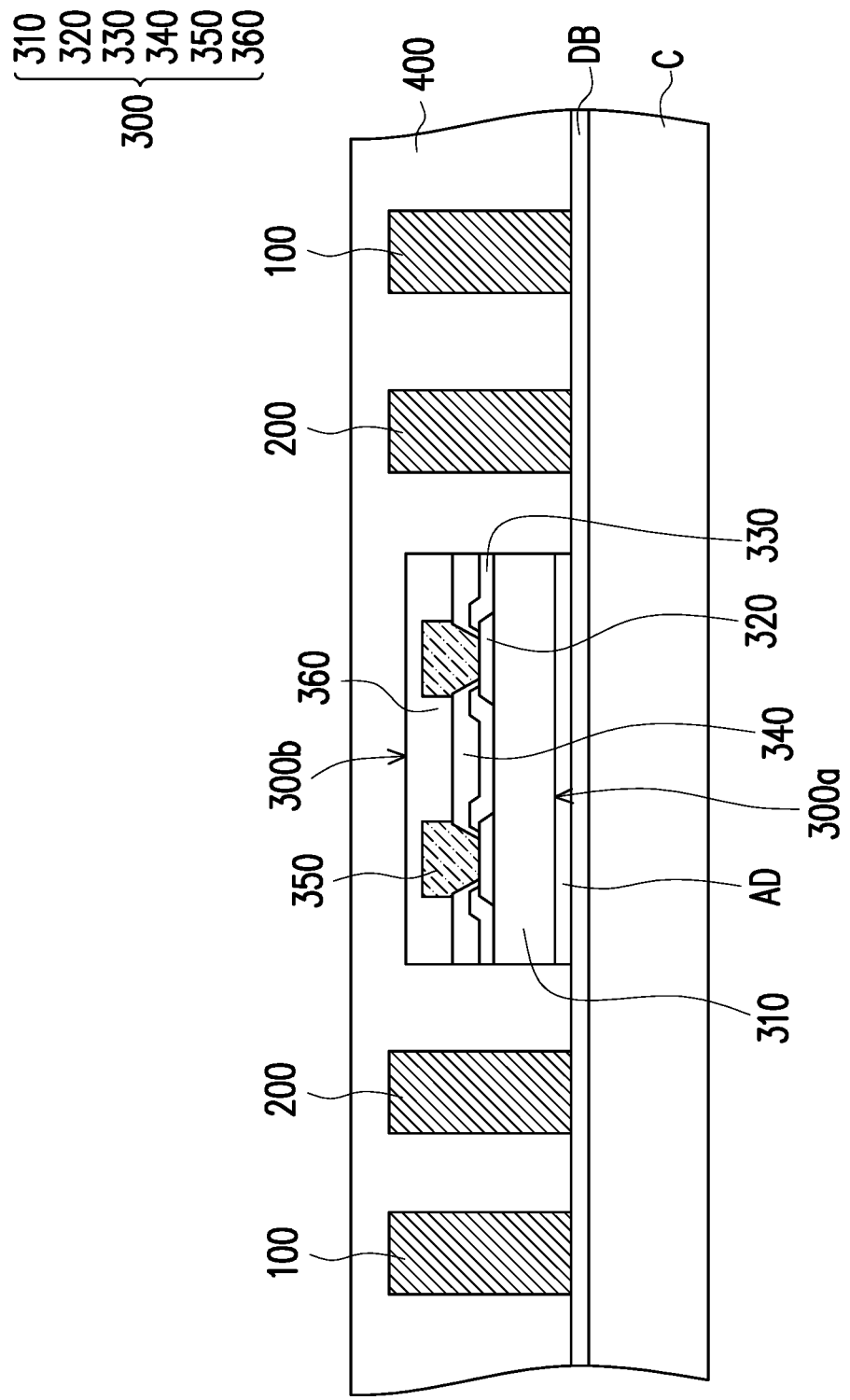
Figure 21:
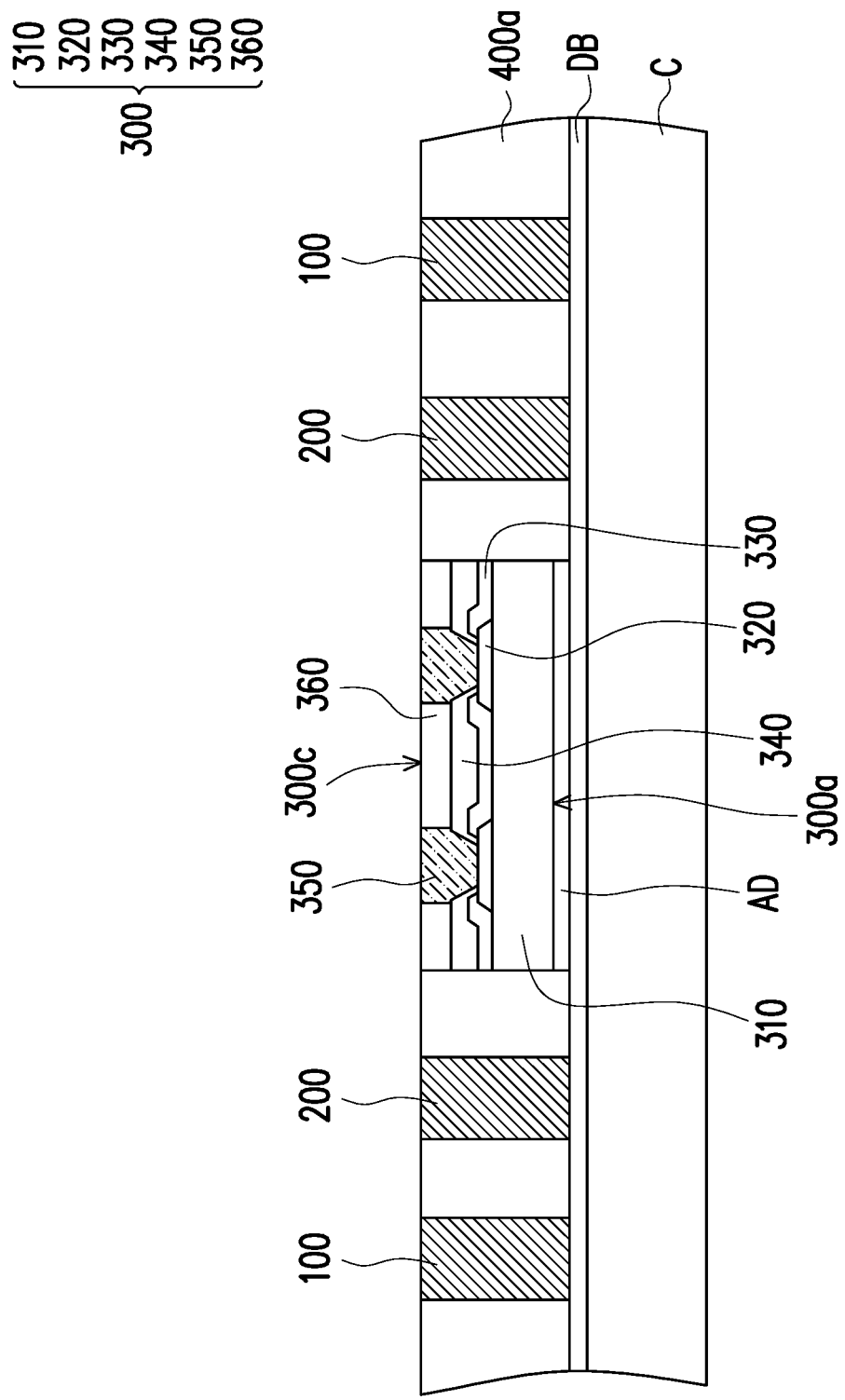

Referring to FIG. 2H, an encapsulation material 400 is formed over the de-bonding layer DB to encapsulate the wall structure 100, the conductive structures 200, and the first die 300. In some embodiments, the encapsulation material 400 is a molding compound, a molding underfill, a resin (such as epoxy), or the like. The encapsulation material 400 may be formed by a molding process, such as a compression molding process. In some embodiments, the encapsulation material 400 is applied over the de-bonding layer DB and the carrier C. As mentioned above, since the wall structure 100 has at least one through channel CH communicating the inner surface 100a and the outer surface 100b of the wall structure 100, the encapsulation material 400 is able to flow into the interior of the wall structure 100 through the through channel CH, thereby encapsulating the first die 300 and the conductive structures 200.

Referring to FIG. 2H and FIG. 2I, the encapsulation material 400 and the protection layer 360 of the first die 300 are grinded until top surfaces of the conductive vias 350 are exposed. After the encapsulation material 400 is grinded, an encapsulant 400a is formed over the de-bonding layer DB to encapsulate the first die 300, the wall structure 100, and the conductive structures 200. In some embodiments, the encapsulant 400a fills the through channels CH of the wall structure 100. That is, at least a portion of the encapsulant 400a is located between the inner surface 100a and the outer surface 100b of the wall structure 100 and penetrates through the wall structure 100. In some embodiments, the portion of the encapsulant 400a penetrating through the wall structure 100 may have a geometry that same as that of the through channels CH of the wall structure 100. For example, as mentioned above, the through channels CH may be semi-cylindrical column shaped through channels, cylindrical column shaped channels, or polygonal column shaped through channels in some embodiments. As such, in some embodiments, the portion of the encapsulant 400a penetrating through the wall structure 100 may be semi-cylindrical columns, cylindrical columns, or polygonal columns. In some embodiments, the portion of the encapsulant 400a penetrating through the wall structure 100 may have a width (in the case of polygonal column), a diameter (in the case of semi-cylindrical column or cylindrical column), and/or a height the same as that of the through channels CH. For example, the portion of the encapsulant 400a penetrating through the wall structure 100 may have a width (may correspond to width d3 shown in FIG. 4B) or a diameter of 30 μm to 1000 μm along the x-axis direction and a height (may correspond to height $H_{CH}$ shown in FIG. 4B) of 15 μm to 500 μm along the z-axis direction. In some embodiments, a ratio between the height (may correspond to height $H_{CH}$ shown in FIG. 4B) of the portion of the encapsulant 400a penetrating through the wall structure 100 to the height $H_{100}$ of the wall structure 100 (shown in FIG. 4B) ranges between 1:67 and 10:1. In some embodiments, when the through channels CH are spaced apart from both of the top surface 100c and the bottom surface 100d of the wall structure 100 (shown in FIG. 4C), the portion of the encapsulant 400a penetrating through the wall structure 100 is also spaced apart from both of the top surface 100c and the bottom surface 100d of the wall structure 100.

The through channels CH of the wall structure 100 provide passages for the encapsulation material 400 such that the encapsulation material 400 may be evenly filled into the interior of the wall structure 100, thereby ensuring the encapsulation reliability of the encapsulant 400a. In some embodiments, the encapsulant material 400 is grinded by a mechanical grinding process and/or a chemical mechanical polishing (CMP) process. In some embodiments, during the grinding process of the encapsulant material 400, the protection layer 360 is grinded to reveal the conductive vias 350. In some embodiments, portions of the conductive vias 350, portions of the conductive structures 200, and portions of the wall structure 100 are slightly grinded as well. After grinding, the first die 300 has an active surface 300c and a rear surface 300a opposite to the active surface 300c. The exposed portion of the conductive vias 350 is located on the active surface 300c of the first die 300. It is noted that the top surfaces of the conductive structures 200, the top surface of the wall structure 100, the top surface of the protection layer 360, and the top surfaces of the conductive vias 350 are substantially coplanar with a top surface of the encapsulant 400a.

Figure 2J:
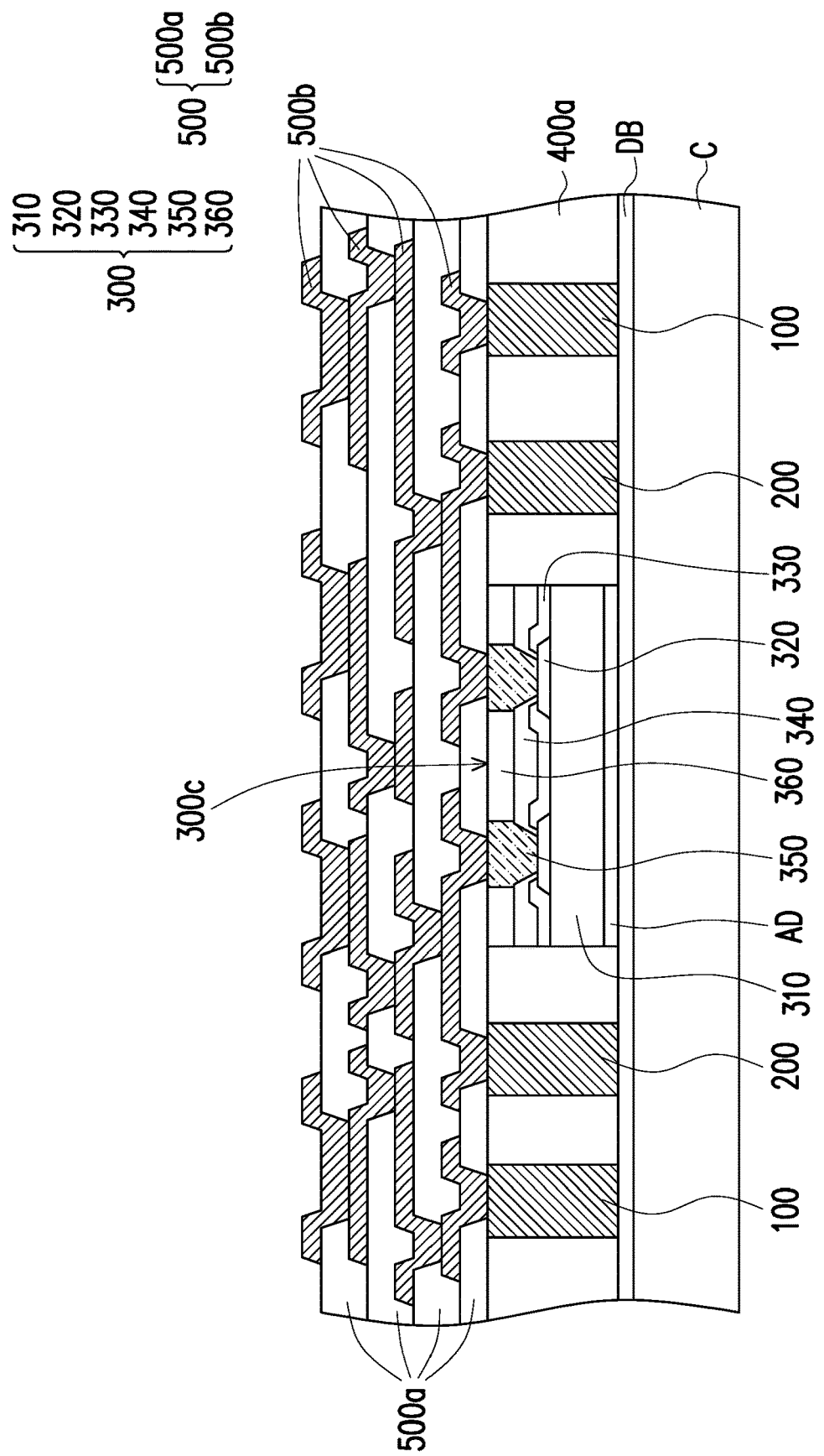

Referring to FIG. 2J, a redistribution structure 500 electrically connected to the conductive vias 350 of the first die 300, the conductive structures 200, and the wall structure 100 is formed on the top surfaces of the conductive structures 200, the top surface of the encapsulant 400a, the top surface of the wall structure 100, the top surfaces of the conductive vias 350, and the top surface of the protection layer 360. In other words, the redistribution structure 500 is formed on the active surface 300c of the first die 300. In some embodiments, the redistribution structures 500 includes a plurality of inter-dielectric layers 500a and a plurality of redistribution conductive layers 500b stacked alternately. The redistribution conductive layers 500b are electrically connected to the conductive vias 350 of the first die 300. Meanwhile, the redistribution conductive layer 500b is also electrically connected to the conductive structures 200 and the wall structure 100 embedded in the encapsulant 400a. In some embodiments, the top surfaces of the conductive vias 350, the top surfaces of the conductive structures 200, and the top surface of the wall structure 100 are in contact with the bottommost redistribution conductive layer 500b of the redistribution structure 500. In some embodiments, the top surfaces of the conductive vias 350, the top surface of the wall structure 100, and the top surfaces of the conductive structures 200 are partially covered by the bottommost inter-dielectric layer 500a. As illustrated in FIG. 2J, the topmost redistribution conductive layer 500b includes a plurality of pads. In some embodiments, the above-mentioned pads include a plurality of under-ball metallurgy (UBM) patterns for ball mount. It should be noted that the number of the inter-dielectric layers 500a and the redistribution conductive layers 500b is not limited in the disclosure. Although not illustrated, it should be understood that the redistribution structure 500 is also electrically connected to the second die 300' and the third die 300" shown in FIG. 1.

Figure 2K:
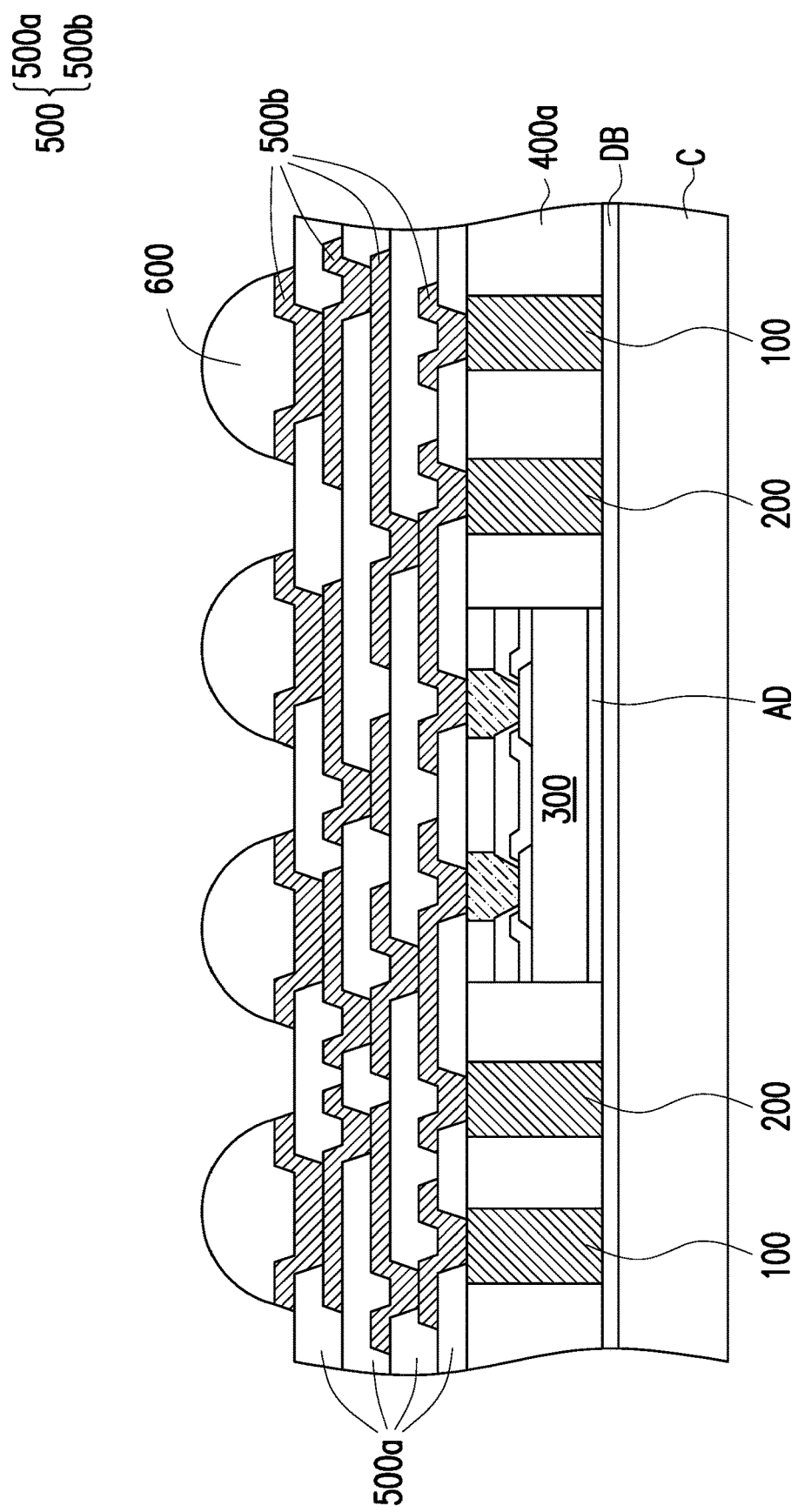

Referring to FIG. 2K, after the redistribution structure 500 is formed, a plurality of conductive terminals 600 are placed on the topmost redistribution conductive layer 500b (the UBM patterns) of the redistribution structure 500. In some embodiments, the conductive terminals 600 include solder balls. In some embodiments, the conductive terminals 600 may be placed on the UBM patterns through a ball placement process.

Figure 2L:
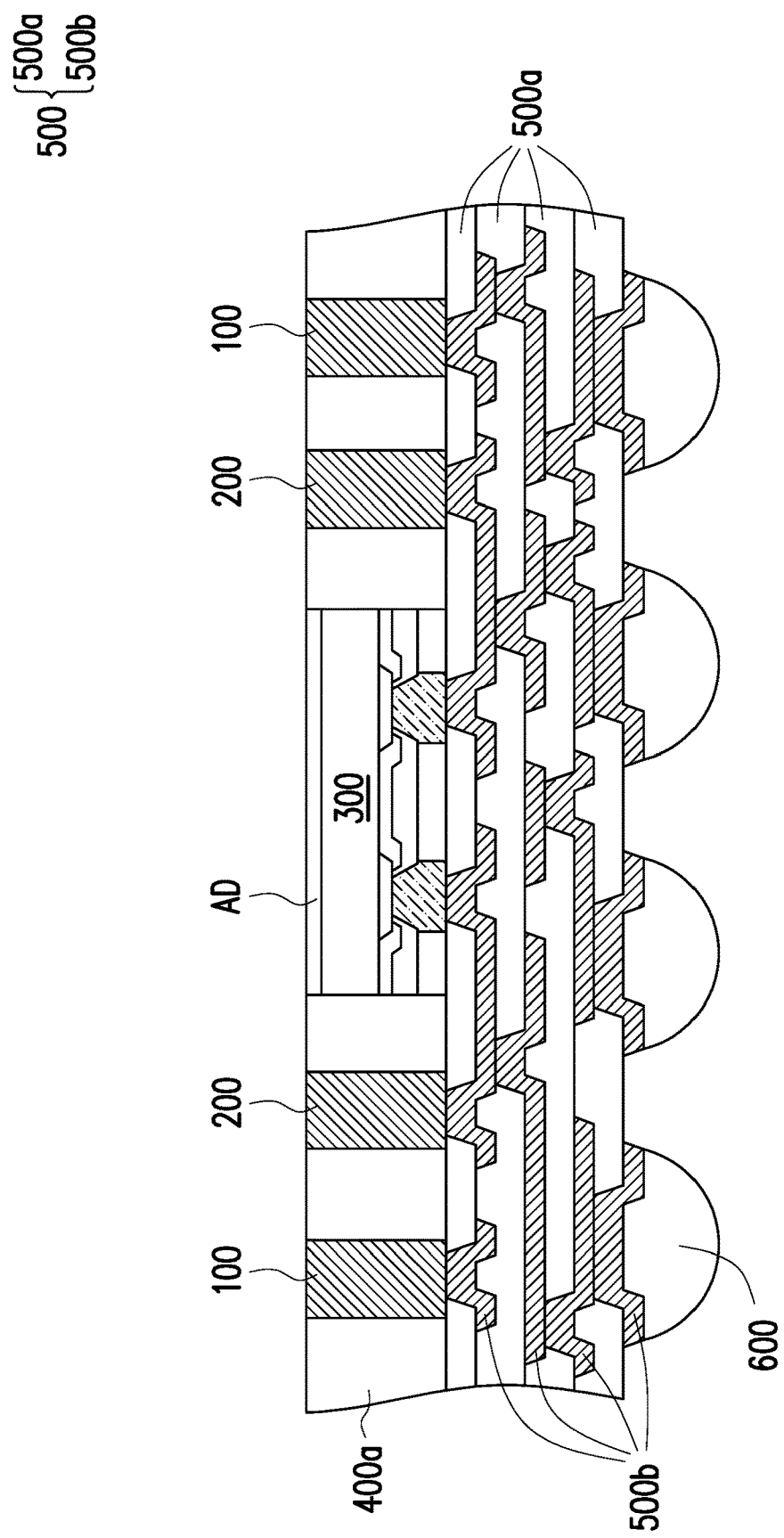

Referring to FIG. 2K and FIG. 2L, after the conductive terminals 600 are formed on the redistribution structure 500, the encapsulant 400a, the wall structure 100, the conductive structures 200, and the adhesive layer AD are de-bonded from the de-bonding layer DB such that the carrier C and the de-bonding layer DB are removed. In some embodiments, the de-bonding layer DB (e.g., the LTHC release layer) may be irradiated by an UV laser such that the carrier C and the de-bonding layer DB may be peeled off. Thereafter, the structure is flipped upside down.

Figure 2M:
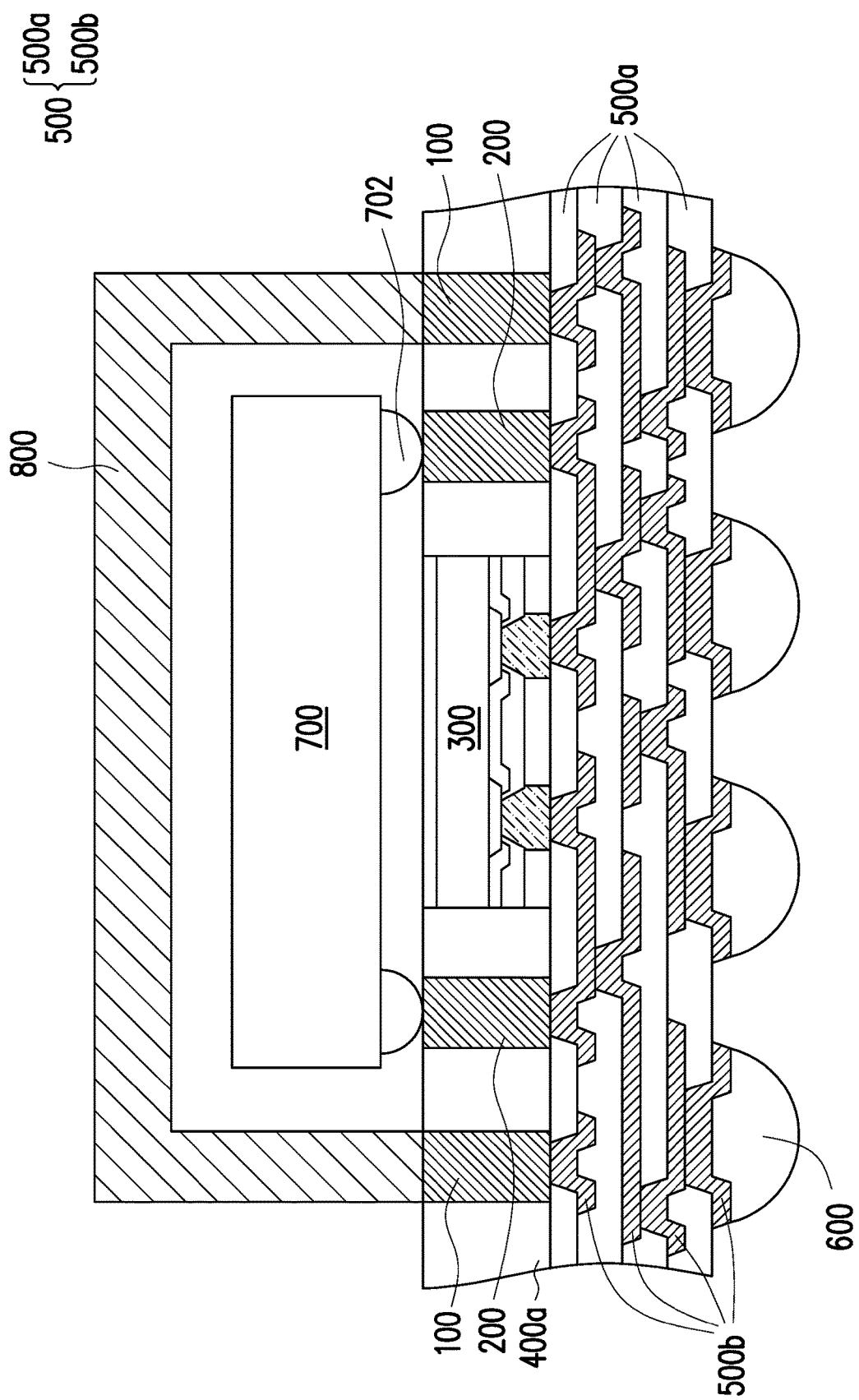

Referring to FIG. 2M, a chip 700 is disposed on the conductive structures 200 opposite to the redistribution structure 500. In some embodiments, the chip 700 is disposed on the conductive structures 200 through conductive joints 702. In some embodiments, the conductive joints 702 may include solder balls. The chip 700 may include memory chip (i.e. DRAM, SRAM, NVRAM, and/or the like) or logic chip. The chip 700 may be electrically connected to the first die 300 sequentially through the conductive joints 702, the conductive structures 200, and the redistribution conductive layer 500b of the redistribution structure 500.

After the chip 700 is disposed on the conductive structures 200, a lid 800 is formed to cover the chip 700. For example, the lid 800 may be disposed over the encapsulant 400a opposite to the redistribution structure 500. In some embodiments, the lid 800 is made of conductive material. The lid 800 may include the same material as the wall structure 100 or the lid 800 may include different materials from the wall structure 100. For example, a material of the lid 800 may include copper, stainless steel, solder, gold, NiFe, NiFeCr, an alloy thereof, a combination thereof, or any other suitable conductive material. In some embodiments, the lid 800 is formed to accommodate the chip 700. For example, the lid 800 may exhibit an upside down U-shape in a cross-sectional view, as shown in FIG. 2M. In some embodiments, the lid 800 is both electrically and physically connected to the wall structure 100. For example, the wall structure 100 and the lid 800 may be electrically grounded. Since the wall structure 100 and the lid 800 together form an enclosure enclosing the first die 300 and the chip 700, the wall structure 100 and the lid 800 may collectively serve as an EMI shielding structure for first die 300 and the chip 700. Meanwhile, since the wall structure 100 and the lid 800 are made of conductive materials, the wall structure 100 and the lid 800 may also be adapted as a thermal dissipation structure. In other words, the heat generated in the first die 300 and the chip 700 during operation may be dissipated to the atmosphere through the path created by the wall structure 100 and the lid 800. With the aid of the wall structure 100 and the lid 800, the reliability of the package 10 may be sufficiently enhanced.

Figure 5:
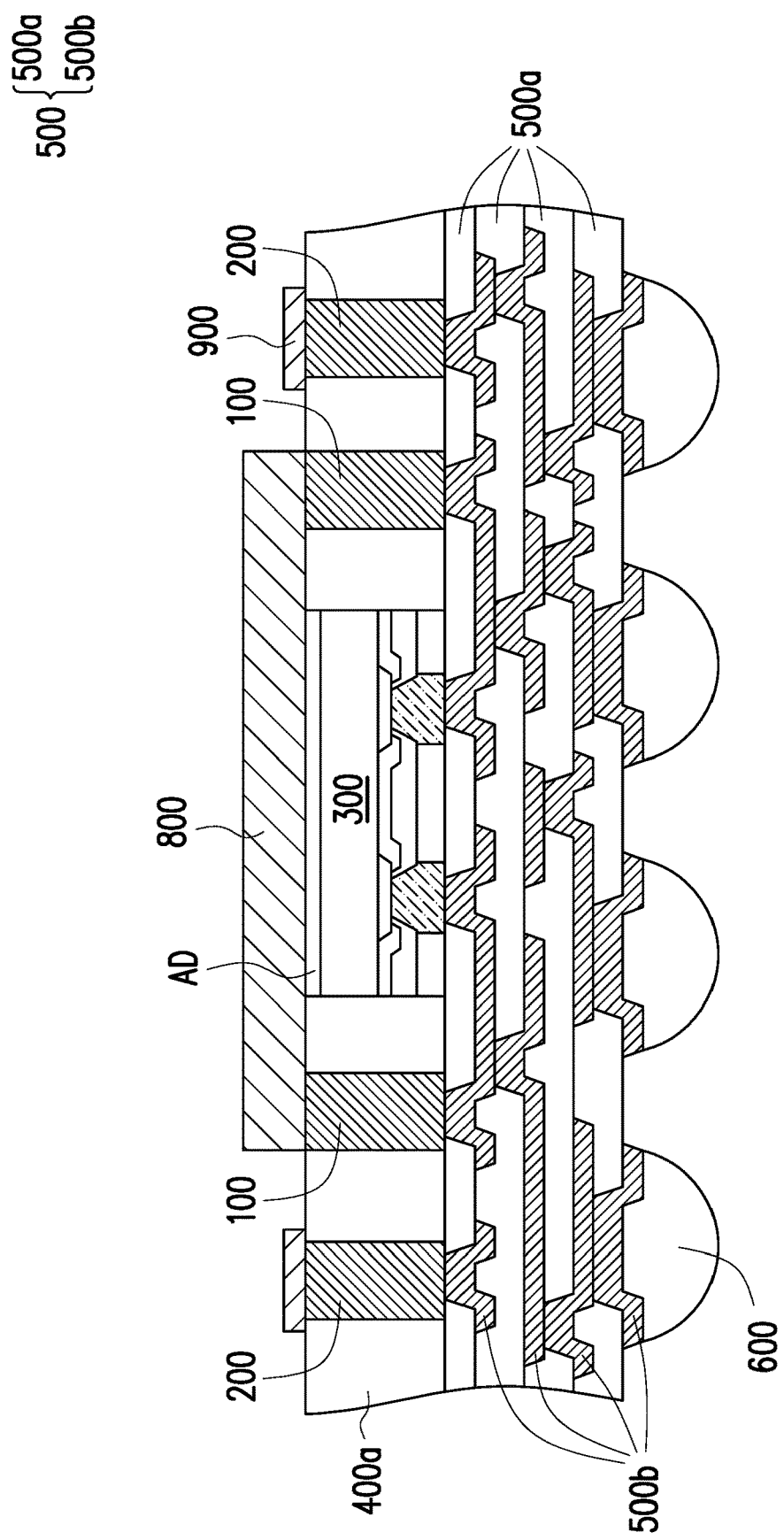
FIG. 5 is a schematic cross-sectional view illustrating a region of a package in accordance with some alternative embodiments of the disclosure.

FIG. 5 is a schematic cross-sectional view illustrating a region R of a package 10 in accordance with some alternative embodiments of the disclosure. The structure illustrated in FIG. 5 is similar to the structure illustrated in FIG. 2M, so similar elements are denoted by the same reference numeral and the detailed descriptions thereof are omitted herein. Referring to FIG. 5, in some embodiments, the conductive structures 200 are disposed outside of the wall structures 100 such that the wall structure 100 is located between the first die 300 and the conductive structures 200. As illustrated in FIG. 5, a lid 800 is attached to the wall structure 100, the encapsulant 400a, and the adhesive layer AD. In some embodiments, the lid 800 is both electrically and physically connected to the wall structure 100. For example, the wall structure 100 and the lid 800 may be electrically grounded. Since the wall structure 100 and the lid 800 together form an enclosure enclosing the first die 300, the wall structure 100 and the lid 800 may collectively serve as an EMI shielding structure for the first die 300. As such, the reliability of the package 10 may be sufficiently enhanced.

In some embodiments, a plurality of conductive patches 900 is formed over the conductive structures 200. The conductive patches 900 may be formed by, for example, a photolithography and an etching processes. In some embodiments, a material of the conductive patches 900 includes aluminum, titanium, copper, nickel, tungsten, and/or alloys thereof. In some embodiments, the radio frequency (RF) signals originated from the first die 300 may be transmitted to the conductive patches 900 sequentially through the redistribution conductive layer 500b and the conductive structures 200. As such, the conductive patches 900 may serve as patch antennas.

Figure 6:
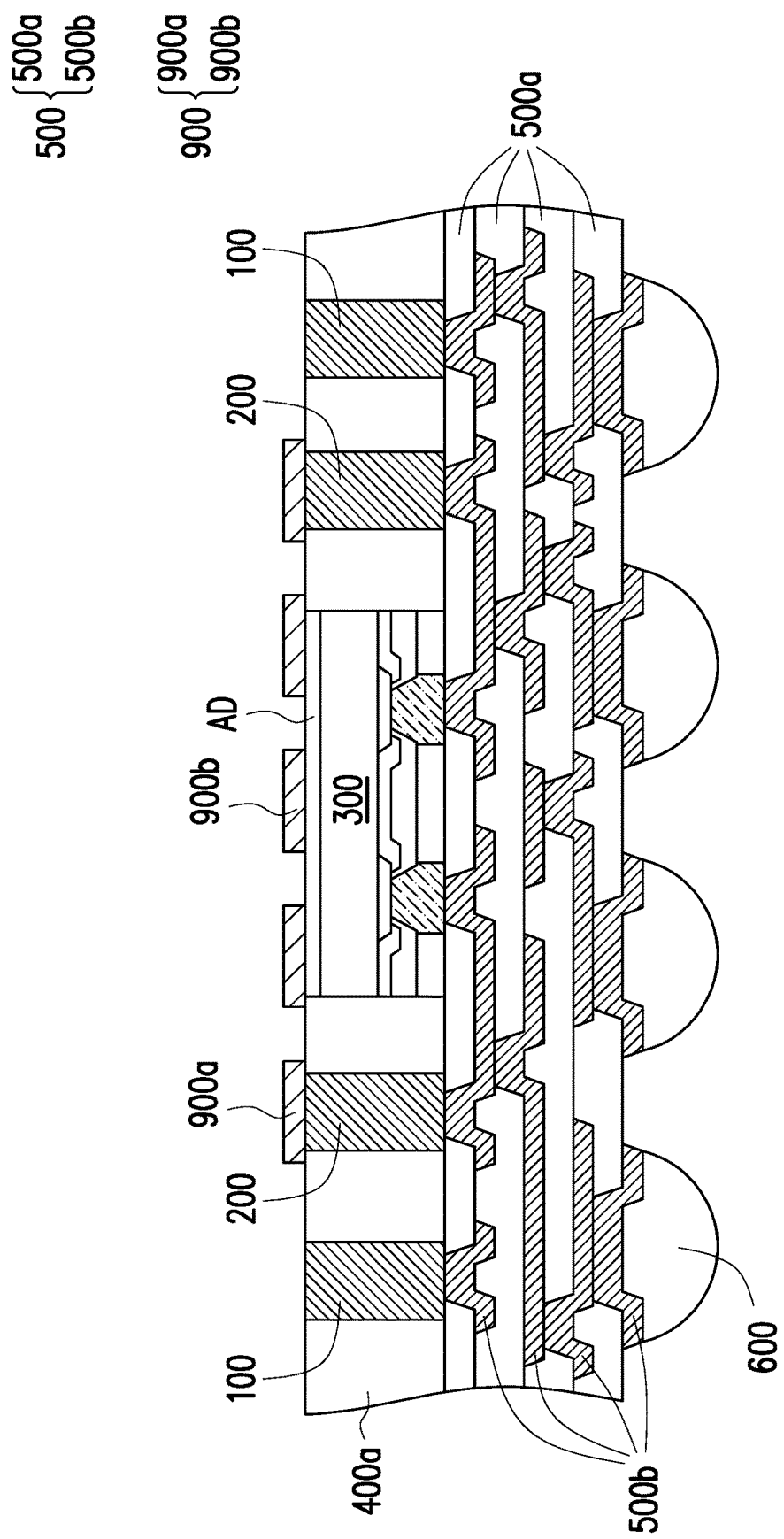
FIG. 6 is a schematic cross-sectional view illustrating a region of a package in accordance with some alternative embodiments of the disclosure.

FIG. 6 is a schematic cross-sectional view illustrating a region R of a package 10 in accordance with some alternative embodiments of the disclosure. The structure illustrated in FIG. 6 is similar to the structure illustrated in FIG. 2M, so similar elements are denoted by the same reference numeral and the detailed descriptions thereof are omitted herein. Referring to FIG. 6, in some embodiments, a plurality of conductive patches 900 is formed over the conductive structures 200, the encapsulant 400a, and the adhesive layer AD. The conductive patches 900 may be constituted by a plurality of first conductive patches 900a and a plurality of second conductive patches 900b. The first conductive patches 900a are physically and electrically connected to the conductive structures 200 while the second conductive patches 900b are physically isolated from the conductive structures 200. The conductive patches 900 may be formed by, for example, a photolithography and an etching processes. In some embodiments, a material of the conductive patches 900 includes aluminum, titanium, copper, nickel, tungsten, and/or alloys thereof. In some embodiments, the radio frequency (RF) signals originated from the first die 300 may be transmitted to the first conductive patches 900a sequentially through the redistribution conductive layer 500b and the conductive structures 200. Thereafter, the signal may be electrically coupled from the first conductive patches 900a to the second conductive patches 900b horizontally. As such, the conductive patches 900 may serve as patch antennas.

In some embodiments, the wall structure 100 is able to receive RF signals originated from the first die 300 through the redistribution conductive layer 500b. As such, the wall structure 100 may serve as one of the electrodes of a dipole antenna. That is, the wall structure 100 is able to couple with other conductive elements embedded in the encapsulant 400a to emit RF signals.

In accordance with some embodiments of the disclosure, a package includes a plurality of dies, a wall structure, a plurality of conductive structures, an encapsulant, and a redistribution structure. The wall structure surrounds at least one of the dies. The wall structure has an inner surface facing the at least one of the dies and an outer surface opposite to the inner surface. The conductive structures surround the at least one of the dies. The encapsulant encapsulates the dies, the wall structure, and the conductive structures. At least a portion of the encapsulant is located between the inner surface and the outer surface of the wall structure and penetrates through the wall structure. The redistribution structure is disposed on the encapsulant. The redistribution structure is electrically connected to the dies and the conductive structures.

In accordance with some embodiments of the disclosure, a package includes a plurality of dies, a wall structure, a plurality of conductive structures, an encapsulant, and a redistribution structure. The wall structure surrounds at least one of the dies. The wall structure includes a framed portion and a staggered portion connected to the frame portion. The staggered portion includes a plurality of body portions and a plurality of bridge portions. The body portions are separated from each other and are connected by the corresponding bridge portion. A height of the bridge portions is smaller than a height of the body portions. A top surface of the body portion is coplanar with a top surface of the bridge portions. The conductive structures surround the at least one of the dies. The encapsulant encapsulates the dies, the wall structure, and the conductive structures. The redistribution structure is disposed on the encapsulant. The redistribution structure is electrically connected to the dies and the conductive structures.

In accordance with some embodiments of the disclosure, a manufacturing method of a package includes at least the following steps. A carrier is provided. A wall structure and a plurality of conductive structures are formed over the carrier. The conductive structures are adjacent to the wall structure. The wall structure is formed through a three-dimensional printing process. The wall structure includes at least one through channel penetrating through the wall structure. A die is placed on the carrier. The wall structure and the conductive structures surround the die. An encapsulation material is applied over the carrier such that the encapsulation material flows through the through channel to form an encapsulant. The encapsulant fills the through channel and encapsulates the wall structure, the die, and the conductive structures. A redistribution structure is formed on the encapsulant. The redistribution structure is electrically connected to the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
    a plurality of dies;
    a wall structure surrounding at least one of the plurality of dies, wherein the wall structure has an inner surface facing the at least one of the plurality of dies and an outer surface opposite to the inner surface;
    a plurality of conductive structures surrounding the at least one of the plurality of dies;
    an encapsulant encapsulating the plurality of dies, the wall structure, and the plurality of conductive structures, wherein at least a portion of the encapsulant is located between the inner surface and the outer surface of the wall structure and penetrates through the wall structure; and
    a redistribution structure disposed on the encapsulant, wherein the redistribution structure is electrically connected to the plurality of dies and the plurality of conductive structures.

2. The package according to claim 1, wherein a material of the wall structure comprises copper, stainless steel, solder, gold, NiFe, NiFeCr, an alloy thereof, or a combination thereof.

3. The package according to claim 1, wherein the wall structure has a height of 50 μm to 1000 μm and a thickness of 50 μm to 500 μm.

4. The package according to claim 1, wherein the at least a portion of the encapsulant comprises semi-cylindrical column, cylindrical column, or polygonal column, and a width or diameter of the at least a portion of the encapsulant ranges between 30 μm and 1000 μm.

5. The package according to claim 1, wherein the at least a portion of the encapsulant is spaced apart from a top surface and a bottom surface of the wall structure.

6. The package according to claim 1, wherein a ratio between a height of the at least a portion of the encapsulant to a height of the wall structure ranges between 1:67 and 10:1.

7. The package according to claim 1, further comprising a lid over the encapsulant opposite to the redistribution structure, wherein the lid is connected to the wall structure.

8. The package according to claim 1, further comprising a plurality of conductive patches over the encapsulant and the plurality of conductive structures, wherein at least a portion of the plurality of conductive patches is electrically connected to the plurality of conductive structures.

9. A package, comprising:
    a plurality of dies;
    a wall structure surrounding at least one of the plurality of dies, wherein the wall structure comprises a framed portion and a staggered portion connected to the framed portion, the staggered portion comprises a plurality of body portions and a plurality of bridge portions, the plurality of body portions is separated from each other and is connected by the corresponding bridge portion, a height of the plurality of bridge portions is smaller than a height of the plurality of body portions, and a top surface of the plurality of body portions is coplanar with a top surface of the plurality of bridge portions;
    a plurality of conductive structures surrounding the at least one of the plurality of dies;
    an encapsulant encapsulating the plurality of dies, the wall structure, and the plurality of conductive structures; and
    a redistribution structure disposed on the encapsulant, wherein the redistribution structure is electrically connected to the plurality of dies and the plurality of conductive structures.

10. The package according to claim 9, wherein a material of the wall structure comprises copper, stainless steel, solder, gold, NiFe, NiFeCr, an alloy thereof, or a combination thereof.

11. The package according to claim 9, wherein the wall structure has a height of 50 μm to 1000 μm and a thickness of 50 μm to 500 μm.

12. The package according to claim 9, wherein the plurality of body portions is parallel to each other and the plurality of bridge portions is perpendicular to the plurality of body portions.

13. The package according to claim 9, wherein a spacing between two adjacent body portions ranges between 30 μm and 1000 μm, and a ratio of the height of the plurality of body portions to the height of the plurality of bridge portions ranges between 1:19 and 33:1.

14. The package according to claim 9, further comprising a lid over the encapsulant opposite to the redistribution structure, wherein the lid is connected to the wall structure.

15. The package according to claim 9, further comprising a plurality of conductive patches over the encapsulant and the plurality of conductive structures, wherein at least a portion of the plurality of conductive patches is electrically connected to the plurality of conductive structures.

16. A manufacturing method of a package, comprising:
   providing a carrier;
   forming a wall structure and a plurality of conductive structures over the carrier, wherein the plurality of conductive structures is adjacent to the wall structure, the wall structure is formed through a three-dimensional printing process, and the wall structure comprises at least one through channel penetrating through the wall structure;
   placing a die on the carrier, wherein the wall structure and the plurality of conductive structures surround the die;
   applying an encapsulation material over the carrier such that the encapsulation material flows through the at least one through channel to form an encapsulant, wherein the encapsulant fills the at least one through channel and encapsulates the wall structure, the die, and the plurality of conductive structures; and
   forming a redistribution structure on the encapsulant, wherein the redistribution structure is electrically connected to the die.

17. The method according to claim 16, wherein the step of forming the wall structure over the carrier comprises:
   forming a seed material layer over the carrier;
   depositing a precursor powder layer over the seed material layer;
   sintering a portion of the precursor powder layer by a laser beam; and
   removing an un-sintered portion of the precursor powder layer and the seed material layer underneath the un-sintered portion of the precursor powder layer to form the wall structure.

18. The method according to claim 16, further comprising:
   forming a plurality of conductive terminals on the redistribution structure.

19. The method according to claim 16, further comprising:
   forming a lid over the encapsulant opposite to the redistribution structure, wherein the lid is connected to the wall structure.

20. The method according to claim 16, further comprising:
   forming a plurality of conductive patches over the encapsulant and the plurality of conductive structures, wherein at least a portion of the plurality of conductive patches is electrically connected to the plurality of conductive structures.

* * * * *